(12) United States Patent
Kim et al.

(10) Patent No.: US 10,651,105 B2
(45) Date of Patent: May 12, 2020

(54) SEMICONDUCTOR CHIP THAT INCLUDES A COVER PROTECTION LAYER COVERING A PORTION OF A PASSIVATION LAYER

(71) Applicant: SAMSUNG ELECTRONICS CO., LTD., Suwon-si, Gyeonggi-Do (KR)

(72) Inventors: Yun-Hee Kim, Cheonan-si (KR); Yoon-Sung Kim, Seoul (KR); Byung-Moon Bae, Daegu (KR); Hyun-Su Sim, Cheonan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/253,047

(22) Filed: Jan. 21, 2019

(65) Prior Publication Data

US 2020/0020604 A1 Jan. 16, 2020

(30) Foreign Application Priority Data

Jul. 12, 2018 (KR) .......................... 10-2018-0081059

(51) Int. Cl.
  *H01L 23/31* (2006.01)
  *H01L 23/544* (2006.01)
  *H01L 21/66* (2006.01)

(52) U.S. Cl.
  CPC .......... *H01L 23/3192* (2013.01); *H01L 22/32* (2013.01); *H01L 23/544* (2013.01); *H01L 2223/5446* (2013.01)

(58) Field of Classification Search
  CPC .... H01L 23/3192; H01L 23/544; H01L 22/32
  See application file for complete search history.

(56) References Cited

U.S. PATENT DOCUMENTS

| 6,462,401 | B2 | 10/2002 | Fujii | |
| 7,129,566 | B2* | 10/2006 | Uehling | H01L 23/585 |
| | | | | 257/620 |
| 7,394,270 | B2* | 7/2008 | Jimi | G01R 31/2884 |
| | | | | 324/750.18 |

(Continued)

FOREIGN PATENT DOCUMENTS

| JP | 2004-253678 | 9/2004 |
| JP | 2015-220264 | 7/2015 |

*Primary Examiner* — Ida M Soward
(74) *Attorney, Agent, or Firm* — F. Chau & Associates, LLC

(57) ABSTRACT

Provided is a semiconductor chip capable of withstanding damage such as cracks created in the fabrication process. A semiconductor chip according to the inventive concept includes: a semiconductor substrate including a residual scribe lane surrounding a die region and a periphery of a die of the die region, a passivation layer covering a portion above the semiconductor substrate, a cover protection layer covering a portion of the passivation layer and the die region, and a cover protection layer formed integrally with a buffering protection layer covering a portion of the residual scribe lane, wherein the buffering protection layer includes a corner protection layer in contact with a portion of an edge adjacent to a corner of the semiconductor substrate, and an extending protection layer extending along the residual scribe lane from the corner protection layer and in contact with the cover protection layer.

20 Claims, 26 Drawing Sheets

(56) References Cited

U.S. PATENT DOCUMENTS

| | | | |
|---|---|---|---|
| 7,692,274 B2* | 4/2010 | Chen | H01L 23/585 |
| | | | 257/618 |
| 7,709,295 B2 | 5/2010 | Fujimura | |
| 7,906,836 B2* | 3/2011 | Chen | H01L 21/78 |
| | | | 257/675 |
| 7,943,529 B2* | 5/2011 | Shiu | H01L 22/34 |
| | | | 257/626 |
| 7,952,167 B2 | 5/2011 | Lee et al. | |
| 8,373,254 B2 | 2/2013 | Chen et al. | |
| 8,692,357 B2 | 4/2014 | Ning | |
| 8,956,955 B2 | 2/2015 | Kogawa et al. | |
| 8,993,355 B2* | 3/2015 | Tsai | H01L 22/34 |
| | | | 438/113 |
| 9,330,976 B2 | 5/2016 | Yakoo et al. | |
| 9,750,140 B2* | 8/2017 | Chen | H05K 3/0052 |
| 9,831,193 B1* | 11/2017 | Jackson | H01L 23/562 |
| 9,935,008 B2 | 4/2018 | Tateishi | |
| 2012/0313094 A1* | 12/2012 | Kato | H01L 22/34 |
| | | | 257/48 |
| 2013/0062747 A1* | 3/2013 | Akiba | B28D 5/022 |
| | | | 257/676 |
| 2013/0221353 A1* | 8/2013 | Yang | H01L 22/32 |
| | | | 257/48 |
| 2016/0293507 A1* | 10/2016 | Shinkawata | H01L 22/34 |
| 2017/0221837 A1 | 8/2017 | Hedrick et al. | |

* cited by examiner

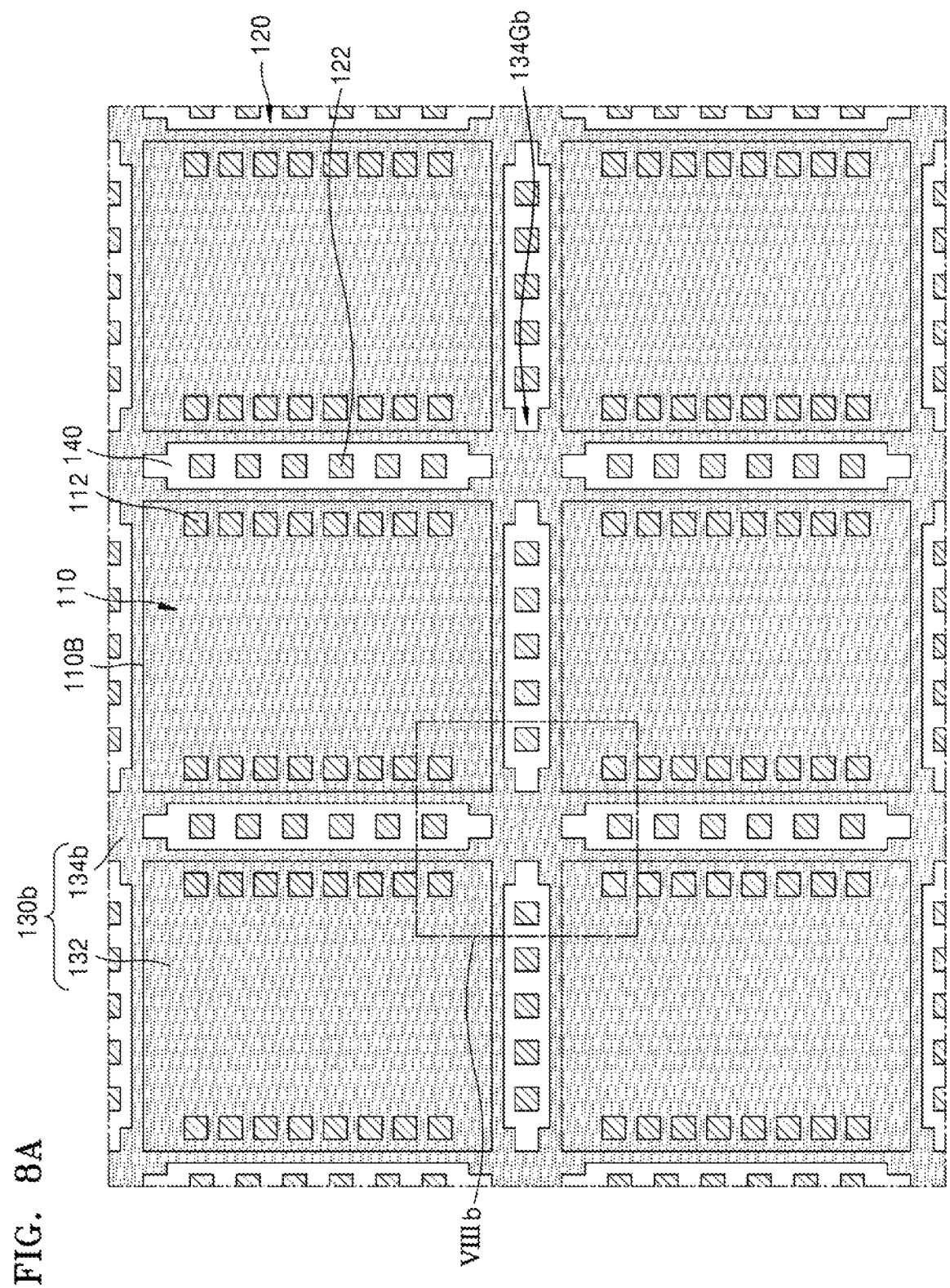

SEMICONDUCTOR CHIP THAT INCLUDES A COVER PROTECTION LAYER COVERING A PORTION OF A PASSIVATION LAYER

CROSS-REFERENCE TO RELATED APPLICATION

This application claims the benefit of Korean Patent Application No. 10-2018-0081059, filed on Jul. 12, 2018, in the Korean Intellectual Property Office, the disclosure of which is herein incorporated by reference in its entirety.

BACKGROUND

1. Technical Field

The present inventive concept relates to a semiconductor chip, and more particularly, to a semiconductor chip having a cover protection layer covering a passivation layer.

2. Description of Related Art

A semiconductor chip may be formed by dividing a semiconductor substrate after forming a semiconductor device on the semiconductor substrate.

As a method of dividing a semiconductor substrate into a plurality of semiconductor chips, a sawing method may be performed using a blade. Alternatively, a method of thinning a semiconductor substrate in order to divide a modified layer along a breaking starting point may be performed after forming the modified layer inside the semiconductor substrate.

SUMMARY

The inventive concept provides for a semiconductor chip which is capable of withstanding damage such as cracks that may otherwise occur in the process of dividing a semiconductor chip from a semiconductor substrate.

According to an exemplary embodiment of the present inventive concept, a semiconductor chip comprises a semiconductor substrate including a residual scribe lane surrounding a die region and a periphery of a die edge of the die region. A passivation layer covers a portion above the semiconductor substrate. A cover protection layer is disposed on a portion of the passivation layer and the die region. The cover protection layer is formed integrally with a buffering protection layer covering a portion of the residual scribe lane. The buffering protection layer has a corner protection layer in contact with a portion of an edge adjacent to a corner of the semiconductor substrate, and an extending protection layer extending along the residual scribe lane extending from a surface of the corner protection layer and contacting the cover protection layer.

According to an exemplary embodiment of the present inventive concept, there is provided a semiconductor chip including a semiconductor substrate and a die region in which a plurality of chip pads are arranged. A semiconductor chip also has a residual scribe lane surrounding a periphery of an edge of the die region in which a plurality of residual test pads are arranged. A passivation layer covers the semiconductor substrate and exposes the plurality of chip pads and the plurality of residual test pads. A cover protection layer covers and integrates with a portion of the passivation layer. The cover protection layer has a first portion covering an interior area of the die edge, a second portion in contact with a portion of an edge adjacent to a corner of the semiconductor substrate in the residual scribe lane, and a third portion extending from the second portion along the residual scribe lane to be spaced apart from the plurality of residual test pads. A portion of an end of the third portion opposite to the second portion is spaced apart from an edge of the semiconductor substrate.

According to an exemplary embodiment of the present inventive concept, there is provided a semiconductor chip comprising a semiconductor substrate and a die region. A plurality of chip pads are arranged in the die region and a residual scribe lane surrounds a periphery of a die edge of the die region. A passivation layer covers a portion above the semiconductor substrate. A cover protection layer covers a portion of the passivation layer. The residual scribe lane comprises a plurality of crossing regions, which are a portion adjacent to each corner of the semiconductor substrate. The residual scribe lane also has a test region, which is a portion wherein a plurality of residual test pads are disposed between the plurality of crossing regions. The cover protection layer has a cover central portion covering the area inside of the die edge, a cover peripheral portion having a constant width from the die edge and surrounding the cover central portion and covering a portion of the residual scribe lane, a corner protection layer in contact with a portion of an edge of the semiconductor substrate in the crossing region, and an extending protection layer extending from the corner protection layer along the residual scribe lane and in contact with the cover peripheral portion in the crossing region.

BRIEF DESCRIPTION OF THE DRAWINGS

The aforementioned and other aspects of the present inventive concept will be more clearly understood with reference to the following detailed description taken in conjunction with the accompanying drawings in which:

FIG. 8A is a plan view illustrating a semiconductor substrate used to fabricate a semiconductor chip according to an exemplary embodiment of the present inventive concept;

DETAILED DESCRIPTION

Figure 1A:
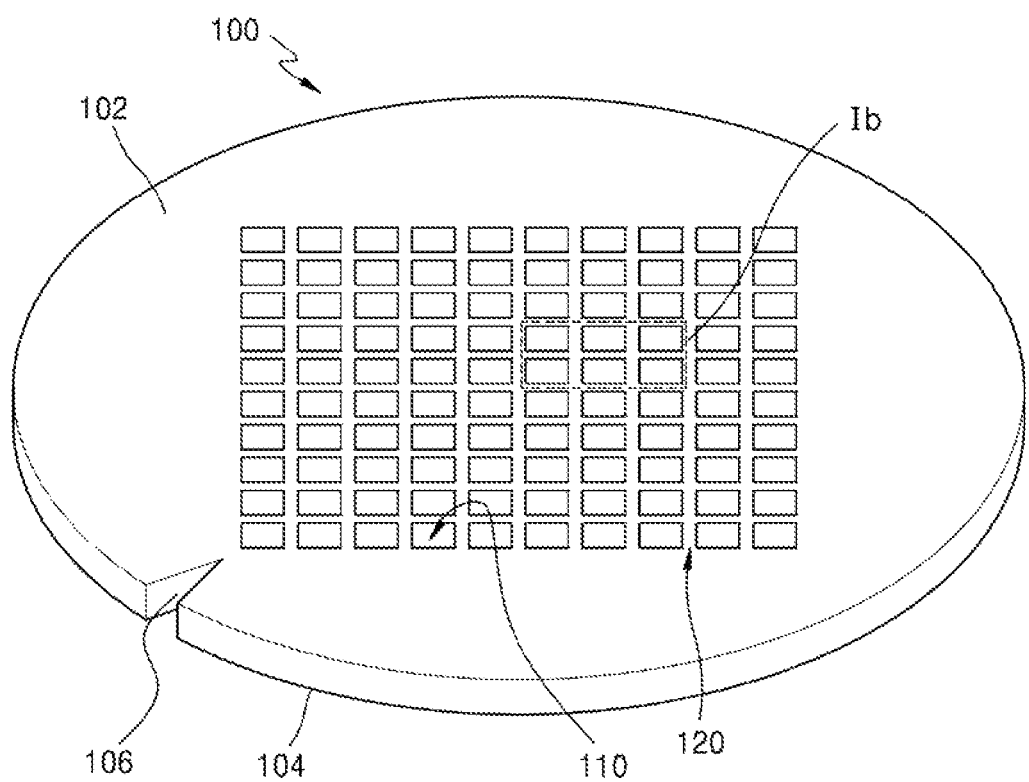
FIG. 1A is a plan view illustrating a semiconductor substrate used to fabricate a semiconductor chip according to an exemplary embodiment of the present invention.

Exemplary embodiments according to the present inventive concept will be described in detail hereafter with reference to corresponding figures. In the drawings, the size of elements may be exaggerated for purposes of clarity, but are not necessarily limited thereto. It shall be understood that like reference numerals may refer to like elements throughout the accompanying drawings. When the term "disposed on" is used to refer to a relationship between elements, it shall be understood that this does not necessarily mean that one element is disposed directly on another, and intervening layers may be present therebetween.

Figure 1B:
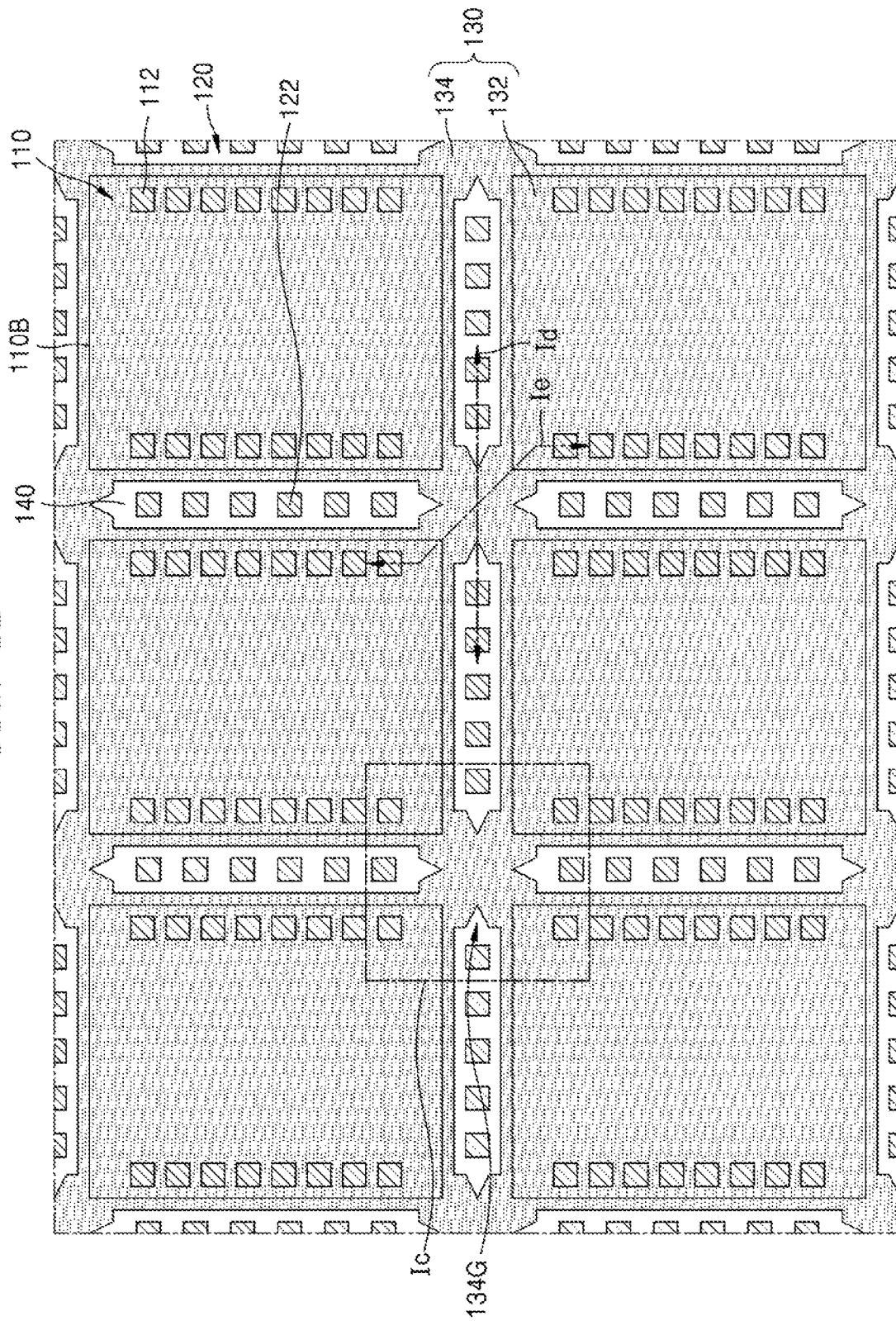
FIG. 1B is an enlarged plan view of area Ib of the semiconductor substrate as illustrated in FIG. 1A.
Figure 1C:
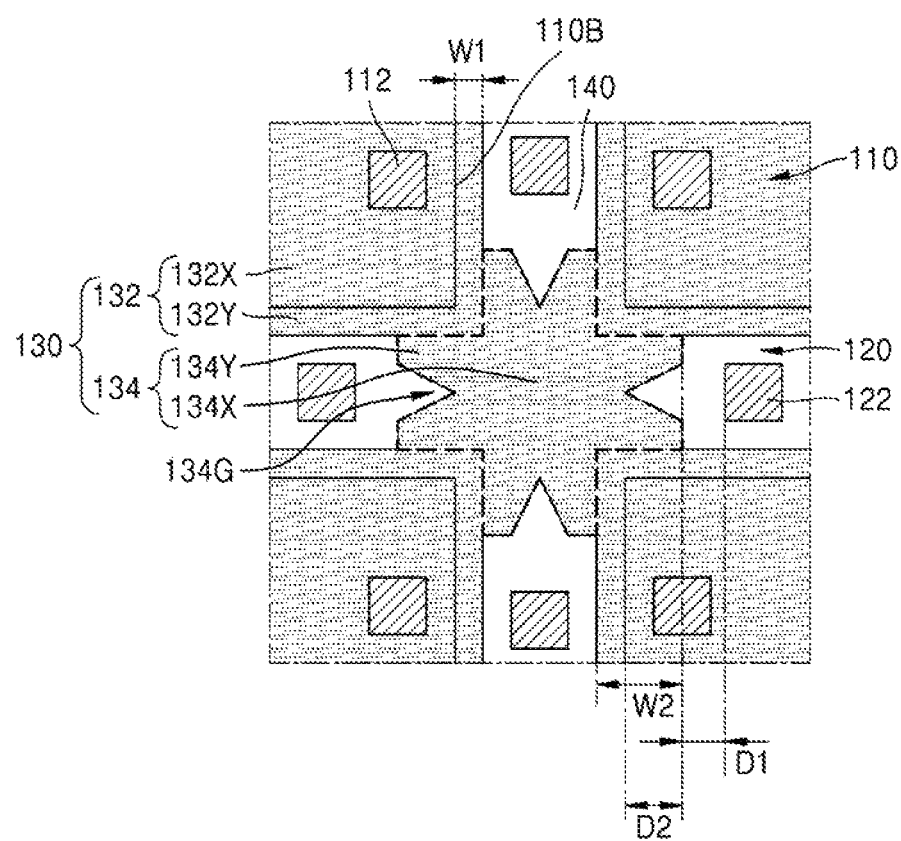
FIG. 1C is an enlarged plan view of area Ic of the semiconductor substrate as illustrated in FIG. 1B.
Figure 1D:
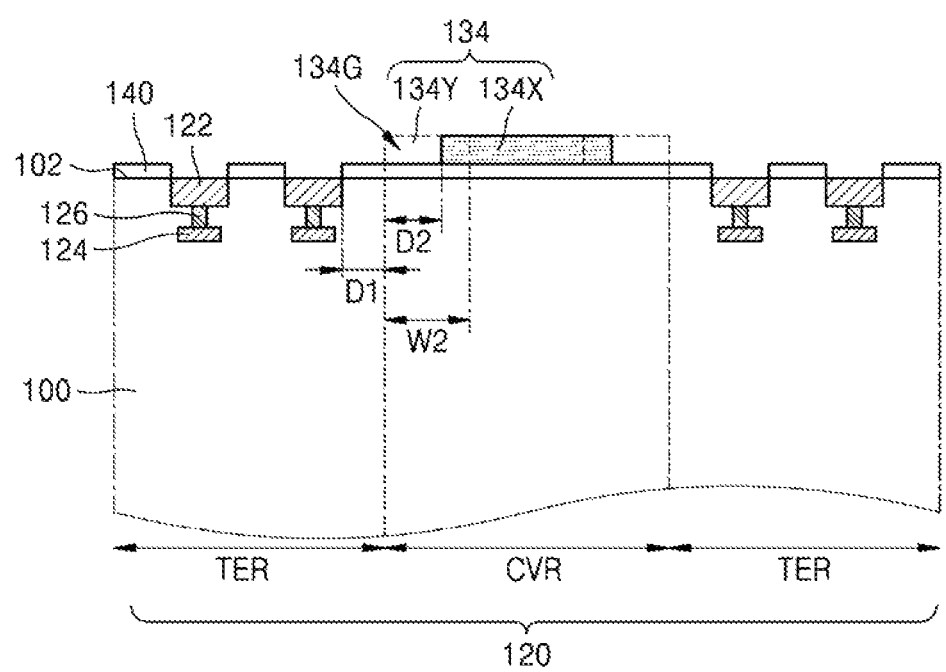
FIG. 1D is a cross sectional view taken along line Id of the semiconductor substrate as illustrated in FIG. 1B.
Figure 1E:
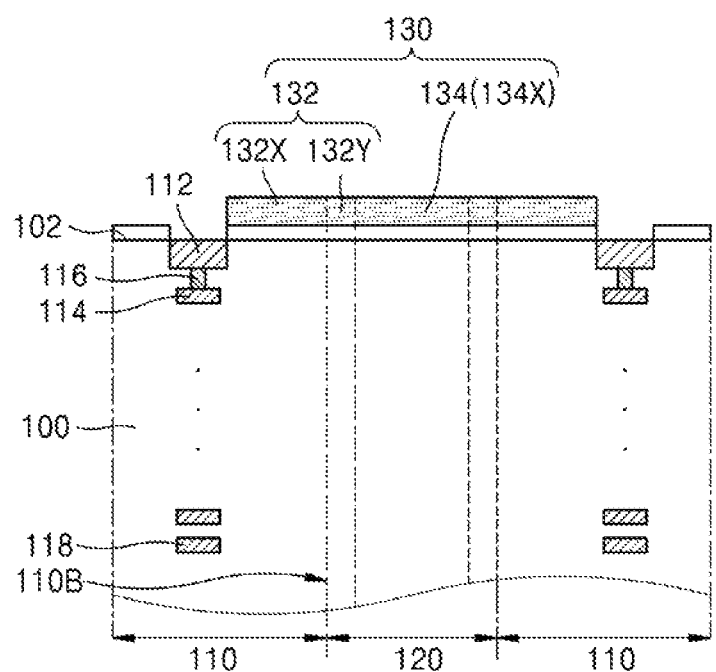
FIG. 1E is a cross sectional view taken along line Ie of the semiconductor substrate as illustrated in FIG. 1B.

FIGS. 1A through 1E include a perspective view, a plan view, and a cross-sectional view, respectively, of a semiconductor substrate 100 used to fabricate a semiconductor chip according to an exemplary embodiment of the present inventive concept. In particular, FIG. 1A is a perspective view of a semiconductor substrate used to fabricate a semiconductor chip. FIG. 1B is a plan view of a region 1b shown in FIG. 1A. FIG. 1C is an enlarged view of a region 1c depicted in FIG. 1B. FIG. 1D is a cross-sectional view taken along line Id shown in FIG. 1B. FIG. 1E is a cross-sectional view taken along line Id in FIG. 1B.

Referring to FIGS. 1A through 1E, the semiconductor substrate 100 may have a first side 102 and a second side 104 opposite to each other, and may be a semiconductor wafer in which a notch 106 is formed. The semiconductor substrate 100 may include, for example, silicon (Si) or germanium (Ge). Alternatively, the semiconductor substrate 100 may include a compound including silicon carbide (SiC), gallium arsenide (GaAs), indium arsenide (InAs), and/or indium phosphide (InP). The semiconductor substrate 100 may include a semiconductor wafer, a conductive material, an insulating material, and a semiconductor material disposed on the semiconductor wafer. The semiconductor substrate 100 may be formed with a semiconductor device 118 including a plurality of individual devices of various kinds disposed on a side of the first side 102.

In an exemplary embodiment of the present inventive concept, the semiconductor substrate 100 may have a main surface with (100) surface orientation. In other embodiments, the semiconductor substrate 100 may have a main surface with (110) surface orientation. A formation direction of the notch 106 in FIG. 1A may be determined according to the surface orientation of a main surface of the semiconductor substrate 100 and a SEMI (Semiconductor Equipment and Materials International) standard.

The semiconductor substrate 100 may have a plurality of die regions 110 disposed on the first side 102 and partitioned into rows and columns by a scribe lane 120. For example, the scribe lane 120 may define the plurality of die regions 110, by orthogonally extending in a direction of the die regions 110 of the semiconductor substrate 100.

A plurality of chip pads 112 may be arranged on the first side 102 of the semiconductor substrate 100 in each of the plurality of die regions 110. According to an exemplary embodiment of the present inventive concept, the plurality of chip pads 112 may be edge pads arranged adjacent to die edges 110B, which are edges of each of the plurality of die regions 110.

According to an exemplary embodiment of the present inventive concept, the plurality of chip pads 112 may be center pads arranged in a central portion of each of the plurality of die regions 110.

The scribe lane 120 may include a test region TER in which a test element group (TEG) is formed, and a crossing region CVR in which no TEG is formed. The crossing region CVR may be a portion of the scribe lane 120 that is orthogonally extending, and a portion adjacent thereto. The test region TER may be a portion of the scribe lane 120 that extends in one direction except for across the crossing region CVR.

In the test region TER of the scribe lane 120, a plurality of test pads 122 may be arranged on the first side 102 of the semiconductor substrate 100. The plurality of test pads 122 may be used to test the TEG formed in the test region TER.

The plurality of chip pads 112 and the plurality of test pads 122 may include an electrically conductive material. For example, the plurality of chip pads 112 and the plurality of test pads 122 may include nickel (Ni), aluminum (Al), copper (Cu), gold (Au), platinum (Pt), and/or tungsten (W). The plurality of chip pads 112 and the plurality of test pads 122 are shown buried in the semiconductor substrate 100 in FIGS. 1D and 1E. However, the present inventive concept is not limited thereto. According to an exemplary embodiment of the present inventive concept, the plurality of chip pads 112 and the plurality of test pads 122 may protrude from the first side 102 of the semiconductor substrate 100.

A passivation layer 140 and a cover protection layer 130 covering a portion of the passivation layer 140 are disposed on the first side 102 of the semiconductor substrate 100. According to an exemplary embodiment of the present inventive concept, a cover protection layer 130 may integrate with a portion of the passivation layer 140. The passivation layer 140 may include an inorganic material, such as an oxide or a nitride. For example, the passivation layer 140 may include a silicon oxide and/or a silicon nitride. The cover protection layer 130 may be formed from, for example, a photosensitive polyimide (PSPI).

The passivation layer 140 may expose the plurality of chip pads 112 and the plurality of test pads 122 arranged on the first side 102 of the semiconductor substrate 100. For example, the passivation layer 140 may cover the entire first side 102 of the semiconductor substrate 100 except for the plurality of the chip pads 112 and the plurality of test pads 122, but is not limited thereto. According to an exemplary embodiment of the present inventive concept, the passivation layer 140 may expose the plurality of chip pads 112 and the plurality of test pads 122, as well as some regions of the first side 102 of the semiconductor substrate 100 adjacent to the plurality of chip pads 112 and the plurality of test pads 122. According to an exemplary embodiment of the present inventive concept, the passivation layer 140 may cover a portion adjacent to each edge of the plurality of chip pads 112 and the plurality of test pads 122. A remaining portion of the plurality of chip pads 112 and the plurality of test pads 122 may be exposed. The passivation layer 140 may cover substantially all of the first side 102 of the semiconductor substrate 100 in the crossing region CVR of the scribe lane 120.

The cover protection layer 130 may cover a portion of an upper surface of the passivation layer 140. The cover protection layer 130 may cover all of the upper surfaces of the passivation layer 140 in the die region 110. According to an exemplary embodiment of the present inventive concept, the cover protection layer 130 may expose a portion of the upper surface of the passivation layer 140 adjacent to the plurality of chip pads 112 in the die region 110.

The cover protection layer 130 may include a first cover protection layer 132 covering the die region 110, and a second cover protection layer 134 covering a portion of the scribe lane 120 in the crossing region CVR. The second cover protection layer 134 may be integrally formed with the first cover protection layer 132. In FIG. 1C, a dashed line extends along a boundary between the first cover protection layer 132 and the second cover protection layer 134 for clarity of description. However, the boundary between the first cover protection layer 132 and the second cover protection layer 134 might not actually exist as they may be integrally formed.

The first cover protection layer 130 may comprise a portion of the cover protection layer 132. The cover protection layer 132 may include a portion covering a portion of the scribe lane 120 that is adjacent to a die edge 110B. For example, the first cover protection layer 132 may include a cover central portion 132X covering the die region 110, and a cover peripheral portion 132Y having a constant first width W1 from the die edge 110B and surrounding the perimeter of the die region 110. The cover central portion 132X and the cover peripheral portion 132Y may be integrally formed. According to an exemplary embodiment of the present inventive concept, the first cover protection layer 132 might not include the cover peripheral portion 132Y and instead might only include the cover central portion 132X.

The second cover protection layer 134 may include a crossing portion disposed on a scribe lane 120 that is orthogonally extending. For example, a cover crossing portion 134X covering a central portion between edges of four die regions 110 adjacent to each other, and a cover extending portion 134Y which is a portion extending along the scribe lane 120 from the cover crossing portion 134X. The cover crossing portion 134X and the cover extending portion 134Y may be integrally formed.

The cover extending portion 134Y may have a second width W2 extending from the cover crossing portion 134X in a direction that the scribe lane 120 extends, and may contact a corner portion of the first cover protection layer 132. The cover extending portion 134Y might not cover the test region TER arranged with the plurality of test pads 122. The cover extending portion 134Y may have a split induction groove 134G disposed in an end opposite to the cover crossing portion 134X. For example, the split induction groove 134G may be disposed at an end of the cover extending portion 134Y adjacent to the test region TER. A width of the split induction groove 134G may gradually narrow in a direction towards the cover crossing portion 134X. A width of an end of the cover extending portion 134Y may be greater than a maximum width of the split induction groove 134G in a same direction. Therefore, the end of the cover extending portion 134Y may be bifurcated by the split induction groove 134G formed therebetween, and may include 2 blunt portions that narrow as they extend along the scribe lane 120 in a direction away from the cover crossing portion 134X.

An end opposite to the cover crossing portion 134X of the cover extending portion 134Y may be spaced apart from the test pad 122 by a first length D1. A first length D1 may be less than a second length D2, which is a length from a corner of the die edge 110B to an end of the cover extending portion 134Y.

The cover central portion 132X, the cover peripheral portion 132Y, the cover crossing portion 134X, and the cover extending portion 134Y of the cover protection layer 130 may be integrally formed, and are shown as distinct elements for convenience of description and illustrative purposes.

A chip wiring 114 and a chip via 116, which are electrically connected to the plurality of chip pads 112, and a test wiring 124 and a test via 126, which are electrically connected to the plurality of test pads 122, may be arranged inside the semiconductor substrate 100.

According to an exemplary embodiment of the present inventive concept, the chip wiring 114, the chip via 116, the test wiring 124, and the test via 126 may include, for example, aluminum (Al), Copper (Cu), or tungsten (W).

A semiconductor device 118 may be arranged inside the semiconductor substrate 100 in the die region 110. The semiconductor device 118 may be electrically connected to the plurality of chip pads 112 through the chip wiring 114 and the chip via 116.

The semiconductor device 118 may be, for example, a memory cell device. According to exemplary embodiments of the present inventive concept, the semiconductor device 118 may be: a flash memory, phase-change RAM (PRAM), resistive RAM (PRAM), ferroelectric RAM (FeRAM), magnetic RAM (MRAM), or a similar device. However, the semiconductor device 118 is not limited thereto. According to an exemplary embodiment of the present inventive concept, the flash memory may be for example, a NAND flash memory device or a V-NAND flash memory device. According to an exemplary embodiment of the present inventive concept, the semiconductor device 118 may be a DRAM device, a SRAM device, a SDRAM device, a SGRAM device, or a RDRAM device. However, the semiconductor device 118 is not limited thereto. According to an exemplary embodiment of the present inventive concept, the semiconductor device 118 may be a logic device.

Figure 5A:
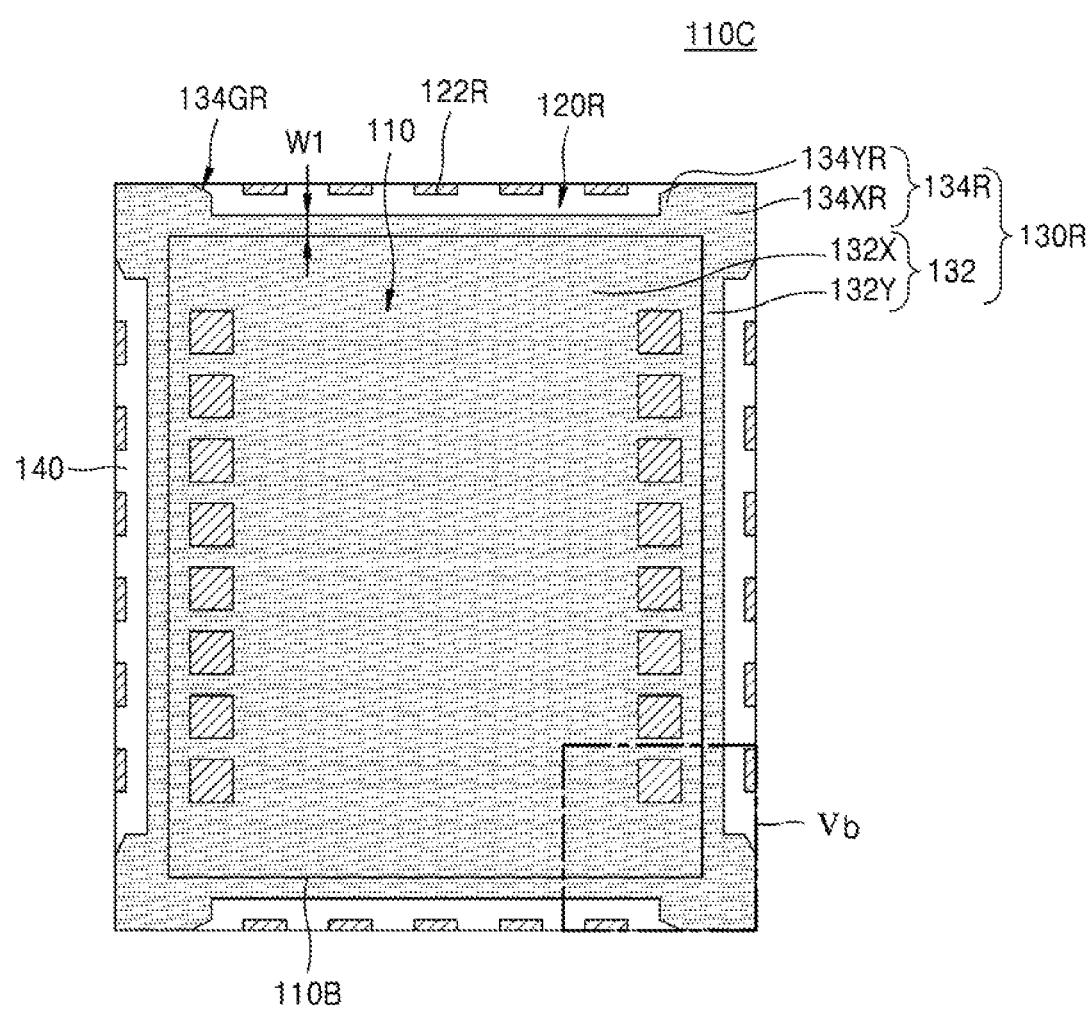
FIG. 5A is a plan view illustrating a semiconductor chip according to an exemplary embodiment of the present inventive concept.

A plurality of die regions 110 of the semiconductor substrate 100 may be divided into a plurality of individual semiconductor chips 110C (see FIG. 5A). Each of the plurality of semiconductor chips 110C may include a die region 110, and a residual scribe lane 120R (see FIG. 5A), which is a portion of the scribe lane 120 that surrounds a periphery of the die region 110.

The first cover protection layer 132 may cover the die region 110 of each of the semiconductor chips 110C, and a portion of the residual scribe lane 120R surrounding the periphery of the die region 110 adjacent to the die edge 110B. The second cover protection layer 134 may cover a portion of the residual scribe lane 120R adjacent to corners of each of the semiconductor chips 110C.

The first cover protection layer 132 may protect each of the plurality of semiconductor chips 110C, the second cover protection layer 134 may serve as a buffer area in order to prevent damage, such as cracks, from occurring when corners of the plurality of semiconductor chips 110C collide with each other during a process of dividing the plurality of semiconductor chips 110C from the semiconductor substrate 100.

FIGS. 2 through 48 are perspective views (FIGS. 2, 3A, and 4A) and plan views (FIGS. 4B and 3B) illustrating a method of fabricating a semiconductor chip 110C, according to an exemplary embodiment of the present inventive concept. In particular, FIGS. 3B and 4B are enlarged plan views corresponding to the Ib region of FIG. 1A.

Figure 2:
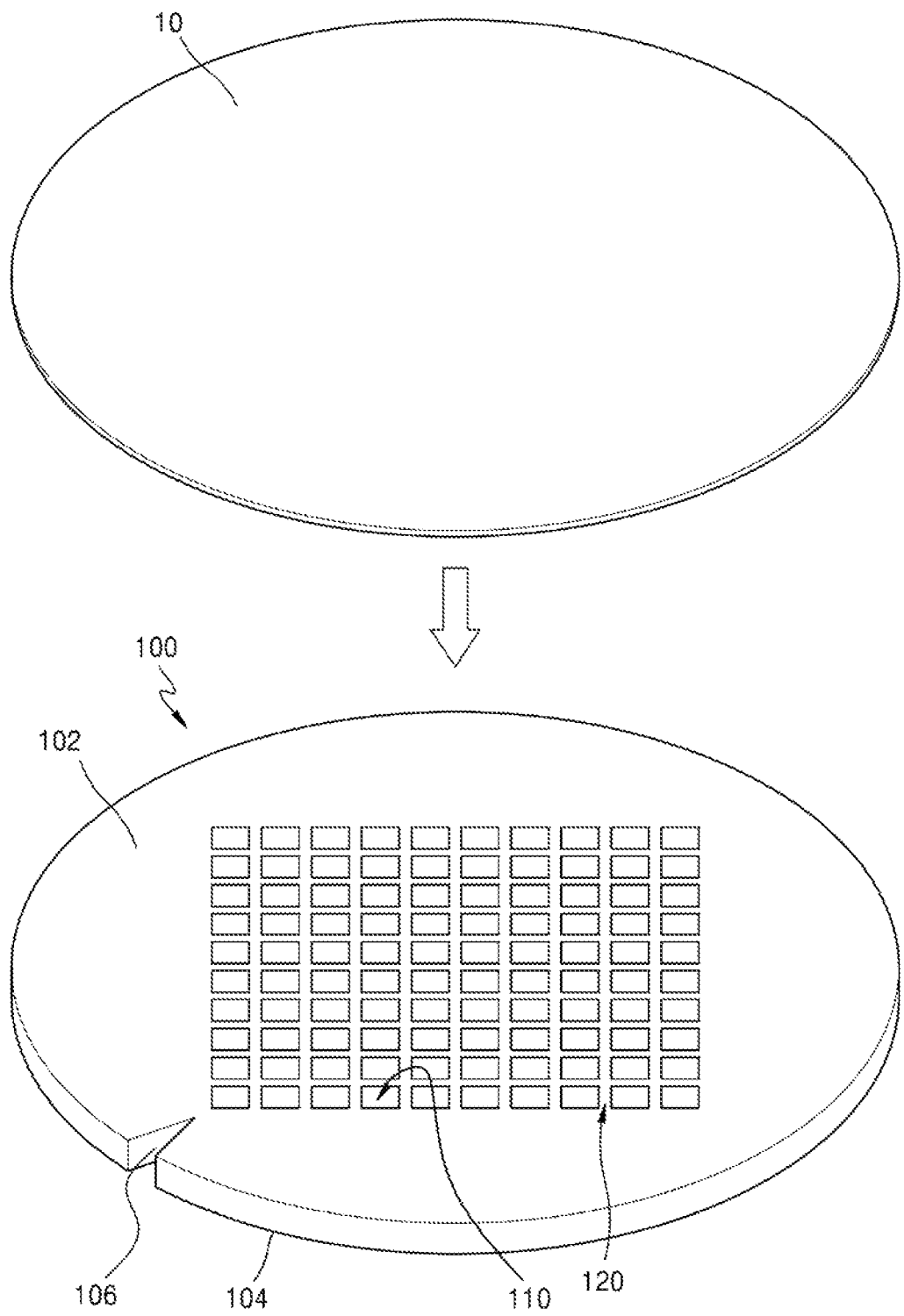
FIGS. 2 through 4B are perspective views (FIGS. 2, 3A, and 4A) and plan views (FIGS. 3B and 4B) illustrating a method of fabricating a semiconductor chip according to an exemplary embodiment of the present inventive concept.

Referring to FIG. 2, a protective tape 10 is adhered to the first side 102 of the semiconductor substrate 100.

Figure 3A:
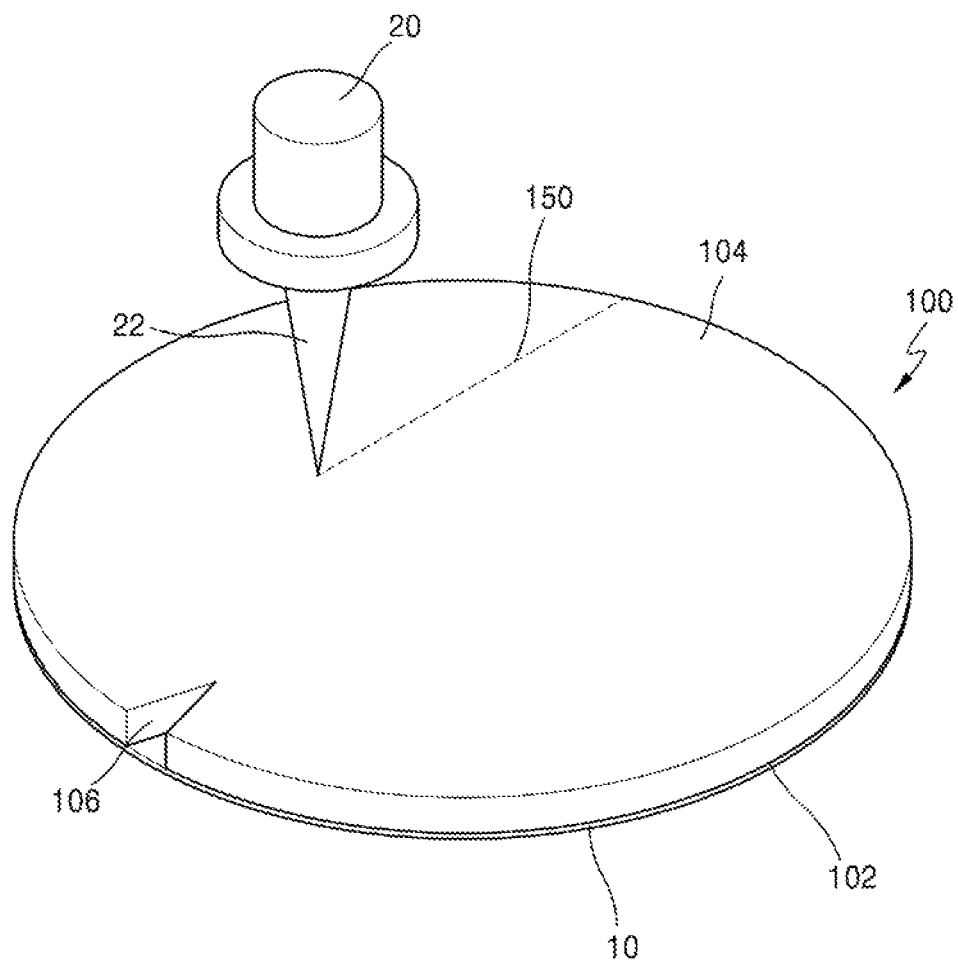
Figure 3B:
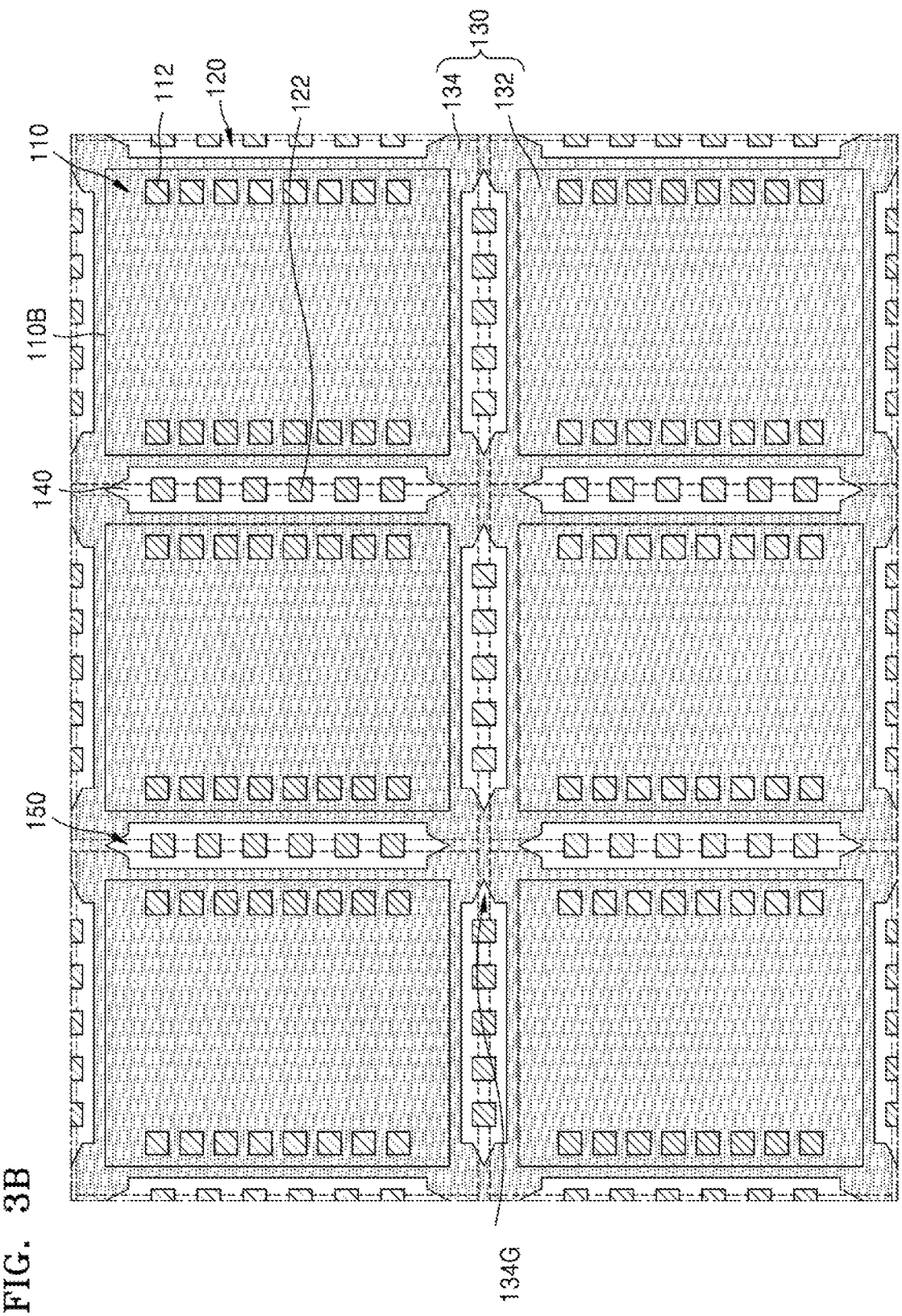

Referring to FIGS. 3A and 3B together, the semiconductor substrate 100 is turned upside down so that side 104 is facing upwards, and then a light-converging point of a laser beam 22 is positioned inside the semiconductor substrate 100 by a condenser 20. The laser beam 22 irradiates the second side 104 of the semiconductor substrate 100 to form a modified layer 150 according to multiphoton absorption inside the semiconductor substrate 100. The laser beam 22 irradiates along the scribe lane 120 such that a modified layer 150 is formed inside the semiconductor substrate 100 in the scribe lane 120. According to an exemplary embodiment of the present inventive concept, the laser beam 22 may irradiate the semiconductor substrate 100 by using a YAG (yttrium aluminum garnet) pulse laser having a wavelength of approximately 1342 nm.

The modified layer 150 may orthogonally extend throughout the inside of the semiconductor substrate 100 along the scribe lane 120. A plurality of modified layers 150 may be perpendicular to each other under the second cover protection layer 134 and extend along a portion of the scribe lane 120 between the first cover protection layers 132 covering two die regions 110 which are adjacent to each other.

The modified layer 150 may be formed in the scribe lane 120 to overlap with the split induction groove 134G. The modified layer 150 may be formed to extend along a gap between two split induction grooves 134G facing each other in the scribe lane 120.

Except for the second cover protection layer 134, the cover protection layer 130 might not be formed in a portion of the scribe lane 120 in which the modified layer 150 is formed. For example, the cover protection layer 130 may be formed only in a relatively small portion of the scribe lane 120 in which the modified layer is 150 formed. Therefore, a disturbance encountered during division of the semiconductor substrate 100 into a plurality of semiconductor chips 110C using the modified layer 150 as a breaking starting point may be minimized.

The modified layer 150 extending across the plurality of test pads 122 inside the semiconductor substrate 100 is shown, but the inventive concept is not limited thereto. For example, the modified layer 150 may extend across all of the plurality of test pads 122 inside the semiconductor substrate 100, extend across only some portions of the plurality of test pads 122, or extend along a portion adjacent to the plurality of test pads 122 without overlapping the plurality of test pads 122.

Figure 4A:
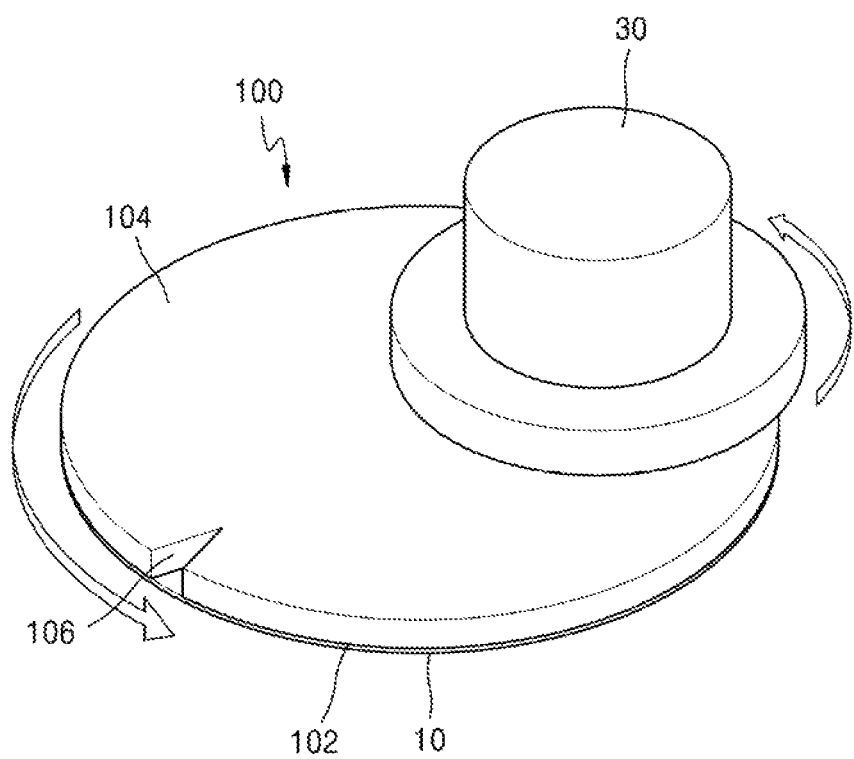
Figure 4B:
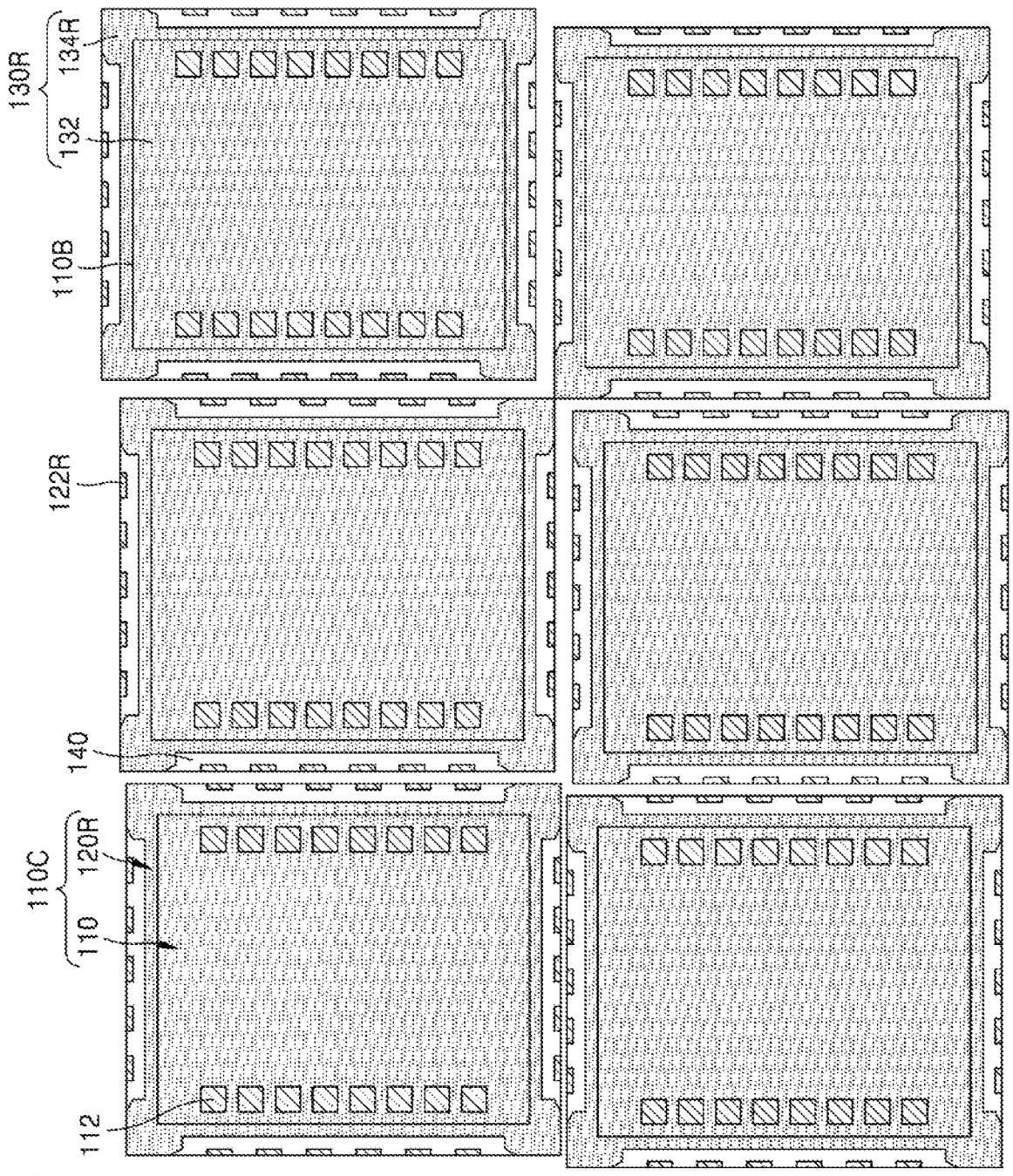

Referring to FIGS. 4A and 4B, the second side 104 of the semiconductor substrate 100 may be grinded down in order to thin the semiconductor substrate 100. The semiconductor substrate 100 is then divided into the plurality of semiconductor chips 110C by using the modified layer 150 (see FIG. 4B) as a breaking starting point. Each of the plurality of semiconductor chips 110C may include the die region 110 and the residual scribe lane 120R, which is a portion of the scribe lane 120 (see FIG. 3B) surrounding the periphery of the die region 110 along the die edge 110B. A portion of the plurality of test pads 122 or the plurality of test pads 122 remaining on the residual scribe lane 120R among the plurality of test pads 122 (see FIG. 4B) may be referred to as residual test pads 122R.

The semiconductor substrate 100 and a grinding apparatus 30 may be independently rotated to grind the second side 104 of the semiconductor substrate 100. According to an exemplary embodiment of the present inventive concept, a rotation direction of the semiconductor substrate 100 and a rotation direction of the grinding apparatus 30 may be substantially the same. According to an exemplary embodiment of the present inventive concept, a rotational speed of the grinding apparatus 30 may be greater than a rotational speed of the semiconductor substrate 100.

Since a pressure may be applied to the semiconductor substrate 100 by the grinding apparatus 30 during a grinding process of the second side 104 of the semiconductor substrate 100, cracks may be generated in the semiconductor substrate 100 in the modified layer 150 operating as the breaking starting point. Thus, portions of the semiconductor substrate 100 may be individually divided into the plurality of semiconductor chips 110C.

According to an exemplary embodiment of the present inventive concept, when the scribe lane 120 (see FIG. 3B) extends in the die regions 110 of the semiconductor substrate 100, generating cracks in the modified layer 150 (see FIG. 3B) as the breaking starting point may be performed in the die region 110. The cover protection layer 130 (see FIG. 1C) may have the split induction groove 134G disposed at an end of the cover extending portion 134Y (see FIG. 1C) of the second cover protection layer 134 (see FIG. 1C). Therefore, generating cracks in the modified layer 150 (see FIG. 38) as the breaking starting point might not be performed in the die region 110 but may instead be performed towards the corners of the plurality of semiconductor chips 110C.

In the process of dividing the semiconductor substrate 100 into the plurality of semiconductor chips 110C, the plurality of semiconductor chips 110C might not be simultaneously divided. During the grinding of the semiconductor substrate 100 in which some portions of the plurality of semiconductor chips 110C are divided, corners of the plurality of semiconductor chips 110C (which are first divided) may collide with corners of other semiconductor chips 110C adjacent thereto. However, a buffering protection layer 134R, which is a portion of the second cover protection layer 134 (see FIG. 3B), may cover a surface of an adjacent portion of the corners of the plurality of the semiconductor chips 110C, and thus, damage, such as cracks, may be prevented even when corners of the plurality of semiconductor chips 110C, which are adjacent to each other, collide with each other. The first cover protection layer 132 may include a die protection layer, and thus, the die protection layer and the buffering protection layer 134R may be integrally formed. The cover protection layer 132 and the buffering protection layer 134R together may be referred to collectively as a chip protection layer 130R.

Figure 5B:
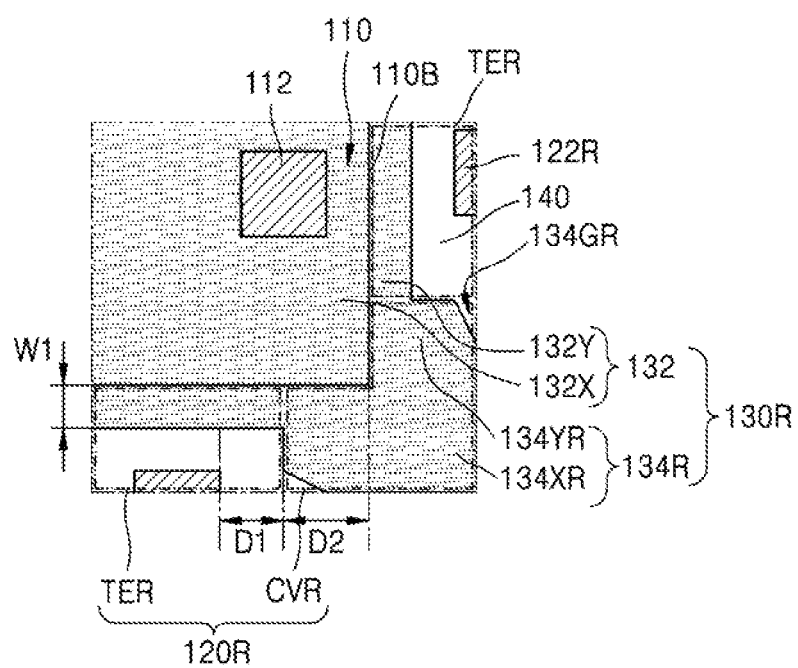
FIG. 5B is an enlarged plan view of area Vb of the semiconductor chip illustrated in FIG. 5A.

FIGS. 5A and 5B are plan views of the semiconductor chip 110C according to an exemplary embodiment of the present inventive concept. In particular, FIG. 5B is an illustration of an enlarged view of the region Vb in FIG. 5A.

Referring to FIGS. 5A and 5B, the semiconductor chip 110C may include a portion of the semiconductor substrate 100 (see FIGS. 1D and 1E), and include a die region 110 and the residual scribe lane 120R surrounding the periphery of the die region 110.

When the scribe lane 120 orthogonally extends in the direction of the die regions 110 of the semiconductor substrate 100 of the semiconductor chip 110C, the residual scribe lane 120R, which is a portion of the scribe lane 120, may also extend in the direction of the die regions 110 of the semiconductor substrate 100.

The semiconductor chip 110C includes the passivation layer 140 and the chip protection layer 130R covering a portion of the passivation layer 140.

The residual scribe lane 120R may include the crossing region CVR, which is a portion adjacent to each of the corners of the die regions 110 of the semiconductor chip 110C, and test regions TER adjacent to lateral sides of the crossing region CVR in which the residual test pads 122R are arranged between adjacent corners of a die region 110.

The passivation layer 140 might not cover, but may instead expose the plurality of chip pads 112 and a plurality of residual test pads 122R.

The chip protection layer 130R may cover a portion of an upper surface of the passivation layer 140. The chip protection layer 130R may cover all of the upper surfaces of the passivation layer 140 in the die region 110, but is not limited thereto. According to an exemplary embodiment of the present inventive concept, the chip protection layer 130R might not cover, but may instead expose a portion of the upper surface of the passivation layer 140 adjacent to the plurality of chip pads 112 in the die region 110.

The chip protection layer 130R may include the cover protection layer 132 covering the die region 110 and the buffering protection layer 134R covering a portion of the residual scribe lane 120R. The cover protection layer 132 and the buffering protection layer 134R may be integrally formed.

The cover protection layer 132 may further cover a portion of the residual scribe lane 120R adjacent to the die edge 110B. For example, the cover protection layer 132 may include the cover central portion 132X covering the die region 110, and the cover peripheral portion 132Y having the constant first width W1 from the die edge 110B. The cover peripheral portion 132Y may contact the cover central portion 132X to surround substantially the entire perimeter of the cover central portion 132X (except corners covered by 134R), and cover a portion of the residual scribe lane 120R. According to an exemplary embodiment of the present inventive concept, the cover peripheral portion 132Y may have a constant first width W1 extending from the die edge 110B towards the scribe lane 120. The residual scribe lane 120R may surround the periphery of the die region 110 and have a width greater than the constant first width W1 of the cover peripheral portion 132Y. The cover central portion 132X and the cover peripheral portion 132Y of the cover protection layer 132 may be integrally formed.

The buffering protection layer 134R may include a corner protection layer 134XR covering a portion of the residual scribe lane 120R and disposed at the corners of the semiconductor chip 110C, and an extending protection layer 134YR which contacts the cover protection layer 132 and extends from a surface of the corner protection layer 134XR along a portion of the residual scribe lane 120R. The corner protection layer 134XR and the extending protection layer 134YR may be integrally formed.

The extending protection layer 134YR of the buffering protection layer 134R covers a portion of the scribe lane 120 in the crossing region CVR and is a portion of the second cover protection layer 134R disposed on the passivation layer 140. Since the passivation layer 140 covers substantially all of the first side 102 of the semiconductor substrate 100, a lower surface of the buffering protection layer 134R may be in contact with an upper surface of the passivation layer 140 in the crossing region CVR.

The corner protection layer 134XR may be in contact with a portion of an edge adjacent to the corners of the semiconductor chip 110C.

The extending protection layer 134YR might not cover the test region TER arranged with the residual test pads 122R. The cover peripheral portion 132Y may cover a portion adjacent to the die edge 110B where the residual test pad 122R is not arranged in the test region TER. The extending protection layer 134YR may have a separation groove 134GR in an end opposite to the corner protection layer 134XR, For example, an end facing the test region TER. A portion of the end of the extending protection layer 134YR may be separated from the edge of a side of the semiconductor chip 110C by the separation groove 134GR. According to an exemplary embodiment of the present inventive concept, the separation groove 134GR may be reduced in width as it extends towards the corner protection layer 134XR. The residual scribe lane 120R extends in the direction of the die regions 110 of the semiconductor substrate 100, the separation groove 134GR may extend in the direction of the die regions 110 of the semiconductor substrate 100 and narrow in width in a direction towards the corner protection layer 134XR.

The residual scribe lane 120R, which is a remaining portion of the scribe lane 120, may have ends that correspond to the separation grooves 134GR.

According to an exemplary embodiment of the present inventive concept, an end of the extending protection layer 134YR may have a blunt shape. A portion of the extending protection layer 134YR adjacent to the separation groove 134GR may extend towards the corner protection layer 134XR and may have a gradually reduced width.

An end of the extending protection layer 134YR opposite to the corner protection layer 134XR may be spaced apart from an adjacent residual test pad 122R. A first length D1, which is a distance between the end of the extending protection layer 134YR and the residual test pad 122R, may be less than a second length D2, which is a length from an edge of the extending protection layer 134YR adjacent to the die edge 110B to the end of the corner protection layer 134XR.

Since the corner protection layer 134XR covers the portion of the corners of the semiconductor chip 110C, damage such as cracks to the corners of the semiconductor chip 110C may be prevented. Since the chip protection layer 130R does not cover the edge of the semiconductor chip 110C (excluding the portion covered by the corner protection layer 134XR) the division may occur without interference when the plurality of semiconductor chips 110C are divided from the semiconductor substrate 100 in FIG. 1A, and cracks in the die region 110 due to the separation groove 134GR may be prevented.

For convenience of explanation, the cover central portion 132X, the cover peripheral portion 132Y, the corner protection layer 134XR, and the extending protection layer 134YR integrally forming the chip protection layer 130R may be respectively named as a first portion 132X, a second portion 132Y, a third portion 134XR, and a fourth portion 134YR.

Figure 6:
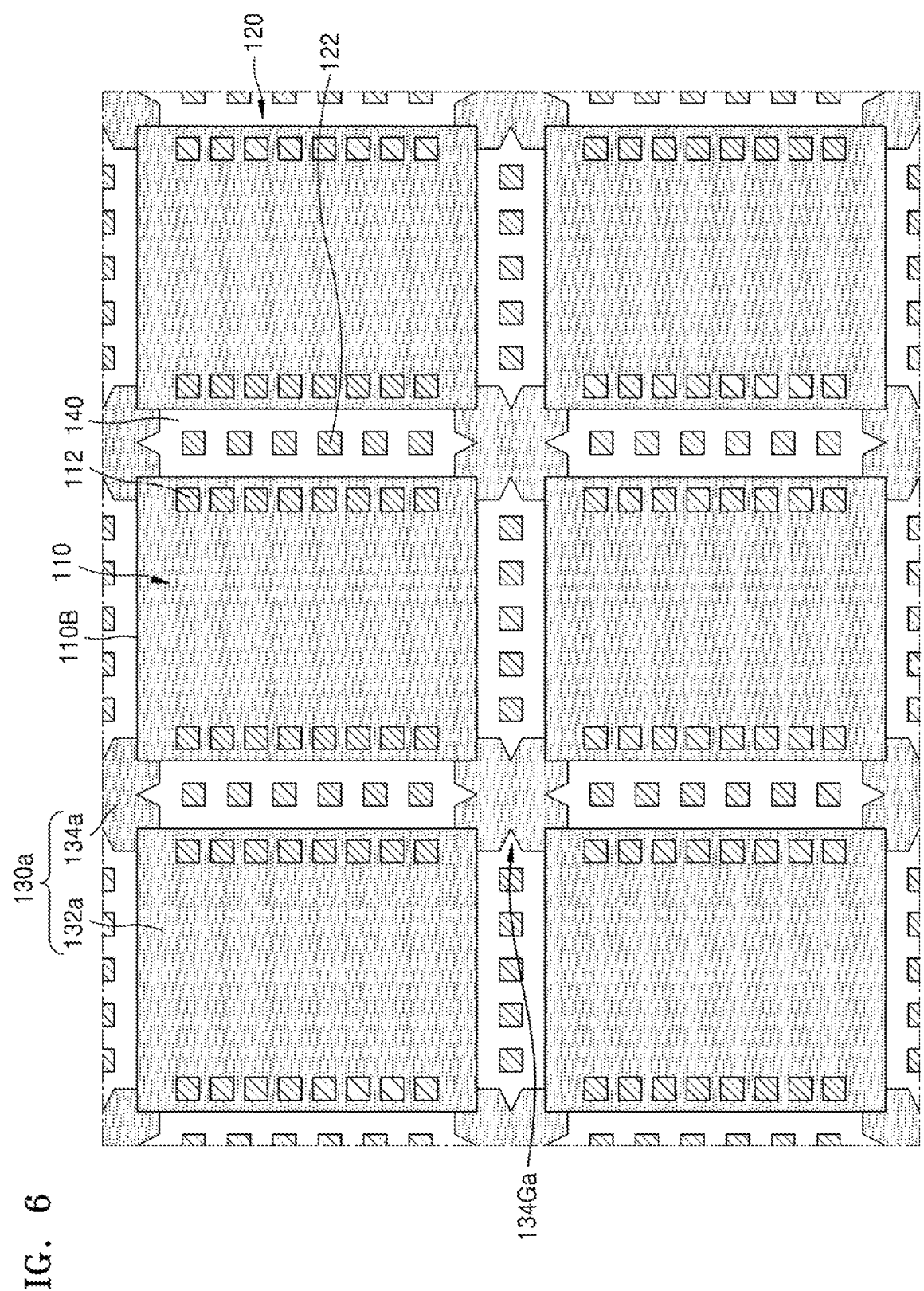
FIG. 6 is a plan view illustrating a semiconductor substrate used to fabricate a semiconductor chip according to an exemplary embodiment of the present inventive concept.

FIG. 6 is a plan view of the semiconductor substrate 100 used to fabricate the semiconductor chip according to an exemplary embodiment of the present inventive concept. In particular, FIG. 6 is a plan view of a portion corresponding to the Ib region in FIG. 1A.

Referring to FIG. 6, the semiconductor substrate 100 may have the plurality of die regions 110 defined by the scribe lane 120 on the first side 102. The plurality of chip pads 112 may be arranged on the first side 102 of the semiconductor substrate 100 in each of the plurality of the die regions 110. The plurality of test pads 122 may be arranged on the first side 102 of the semiconductor substrate 100 in the scribe lane 120.

The passivation layer 140 and a cover protection layer 130a covering a portion of the passivation layer are disposed on the first side 102 of the semiconductor substrate 100. The cover protection layer 130a may cover a portion of the upper surface of the passivation layer 140.

The cover protection layer 130a may include a first cover protection layer 132a covering the die region 110 and a second cover protection layer 134a covering a portion of the scribe lane 120. The first cover protection layer 132a and the second cover protection layer 134a may be integrally formed.

The first cover protection layer 132a may be a portion covering an area of the die region 110 inside the die edge 110B. The first cover protection layer 132a might not cover the scribe lane 120.

The second cover protection layer 134a may overlap a crossing portion of the scribe lane 120 that is orthogonally extending. For example, the second cover protection layer 134a may overlap a portion disposed between edges of four die regions 110 adjacent to each other and a portion extending along the scribe lane 120.

The second cover protection layer 134a may have a split induction groove 134Ga disposed at an end of the portion extending along the scribe lane 120. The split induction groove 134Ga may extend towards an interior of the second cover protection layer 134a and gradually narrow. A width of an end of the second cover protection layer 134a extending along the scribe lane 120 may be greater than a maximum width of the split induction groove 134Ga in a same direction. The end of the portion extending along the scribe lane 120 of the second cover protection layer 134a may be bifurcated by the split induction groove 134Ga disposed therebetween, and may include 2 blunt portions which are narrowed in width as they extend along the scribe lane 120.

The end of the portion extending along the scribe lane 120 of the second cover protection layer 134a may be spaced apart from the plurality of test pads 122.

Figure 7:
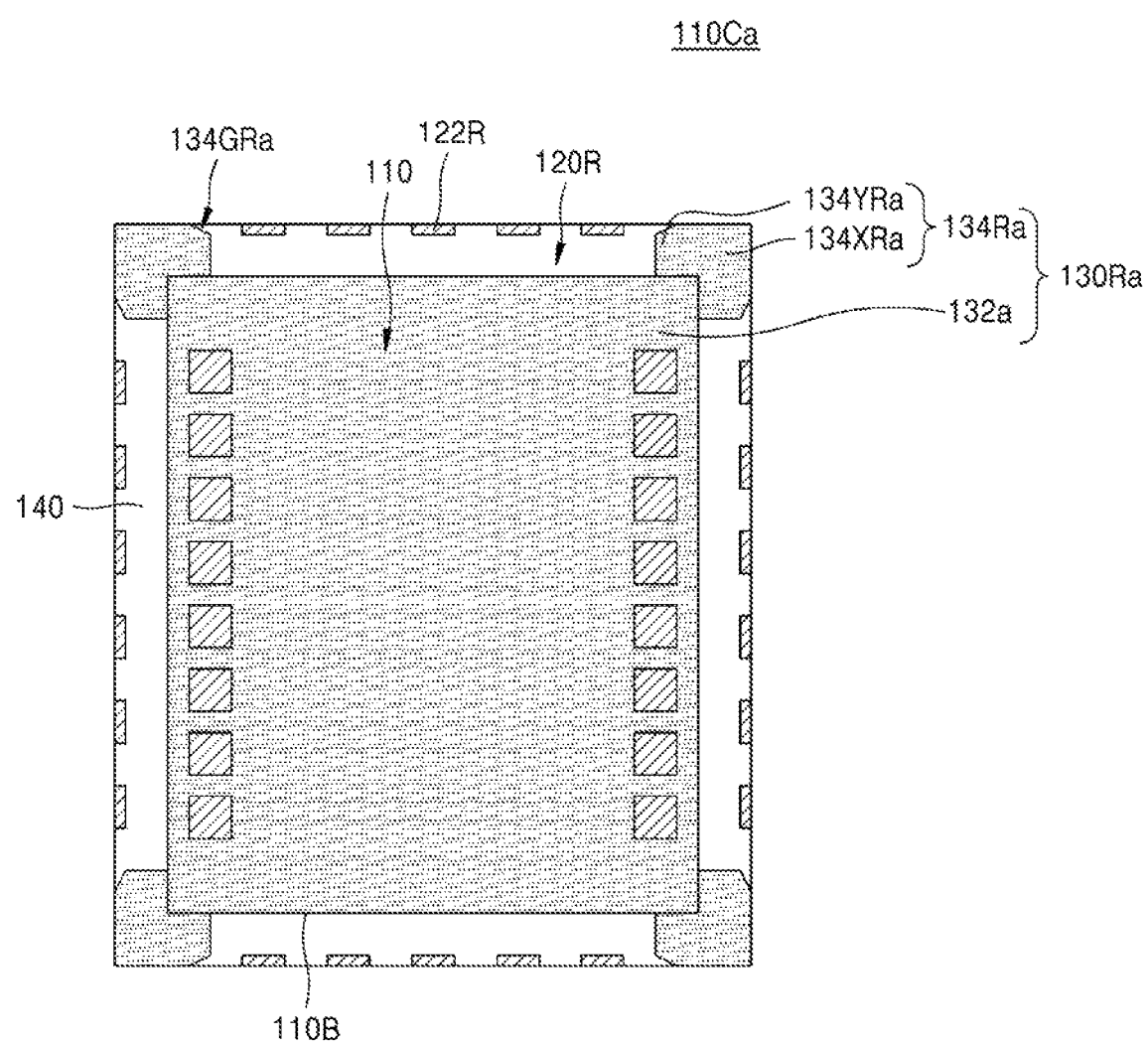
FIG. 7 is a plan view illustrating a semiconductor chip according to an exemplary embodiment of the present inventive concept.

FIG. 7 is a plan view of a semiconductor chip 110Ca according to an exemplary embodiment of the present inventive concept.

Referring to FIG. 7, the semiconductor chip 110Ca may include the die region 110 and the residual scribe lane 120R surrounding the periphery of the die region 110.

The semiconductor chip 110Ca may include the passivation layer 140 and a chip protection layer 130Ra covering a portion of the passivation layer 140.

The passivation layer 140 might not cover, but may instead expose the plurality of chip pads 112 and a plurality of residual test pads 122R.

The chip protection layer 130Ra may cover a portion of an upper surface of the passivation layer 140. The chip protection layer 130Ra may cover all of the upper surfaces of the passivation layer 140 in the die region 110, but is not limited thereto. According to an exemplary embodiment of the present inventive concept, the chip protection layer 130Ra might not cover but may instead expose a portion of the upper surface of the passivation layer 140 adjacent to the plurality of chip pads 112 in the die region 110.

The chip protection layer 130Ra may include the cover protection layer 132a covering only the area of the die region 110 inside the die edge 110B, and a buffering protection layer 134Ra covering a portion of the plurality of residual scribe lanes 120R. The cover protection layer 132a and the buffering protection layer 134Ra may be integrally formed.

The buffering protection layer 134Ra may include the corner protection layer 134XRa covering a portion of the plurality of residual scribe lanes 120R of corners of the semiconductor chip 110Ca, and an extending protection layer 134YRa which is a portion in contact with the cover protection layer 132a and extends along the die edge 110B in the residual scribe lane 120R. The corner protection layer 134XRa and the extending protection layer 134YRa may be integrally formed.

An end of the extending protection layer 134YRa opposite to the corner protection layer 134XRa may be spaced apart from the residual test pad 122R. The end of the extending protection layer 134YRa opposite to the corner protection layer 134XRa may have a separation groove 134GRa. A portion of the end of the extending protection layer 134YRa may be separated from the edge of the semiconductor chip 110Ca by the separation groove 134GRa. An end of the extending protection layer 134YRa may have a blunt shape. A portion of the extending protection layer 134YRa adjacent to the separation groove 134GRa may extend towards the end of the extending protection layer 134YRa and may be gradually reduced in width.

Since the comrner protection layer 134XRa covers the portion of the semiconductor chip 110Ca adjacent to the corners of the semiconductor chip 110Ca, damage such as cracks to the corners of the semiconductor chip 110C may be prevented. Since the chip protection layer 130Ra does not cover the edge of the semiconductor chip 110Ca (excluding the portion covered by the corner protection layer 134XRa) the plurality of semiconductor chips 110Ca may be divided from the semiconductor substrate 100 in FIG. 1A without interference, and cracks in the die region 110 may be prevented due to the separation groove 134GRa.

For convenience of explanation, the cover protection layer 132a, the corner protection layer 134XRa, and the extending protection layer 134YRa integrally forming the chip protection layer 130Ra may be respectively named as a first portion 132a, a second portion 134XRa, and a third portion 134YRa.

Figure 8B:
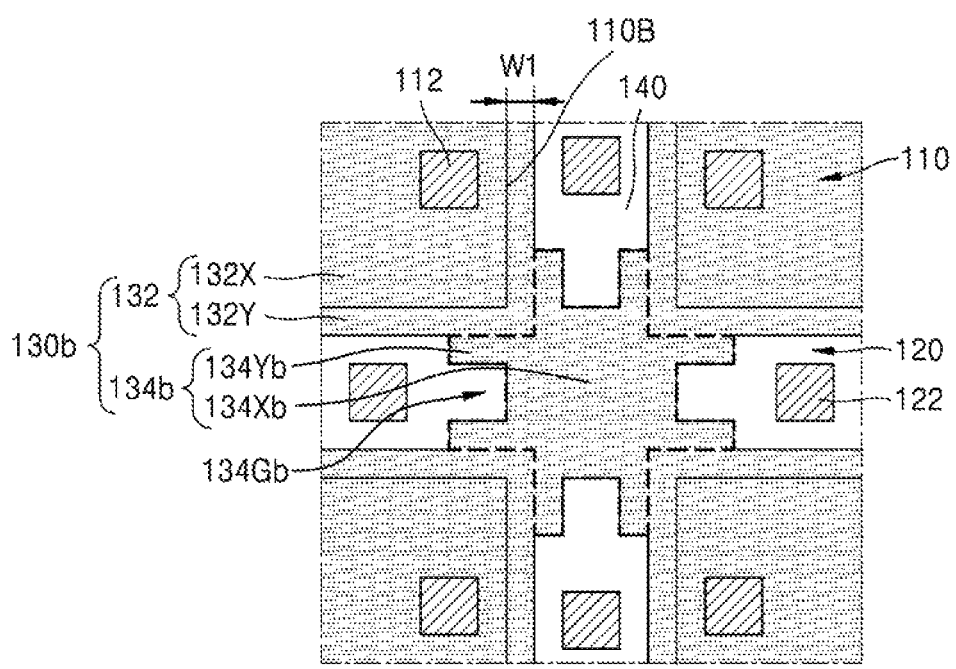
FIG. 8B is an enlarged plan view illustrating area VIIIb of FIG. 8A.

FIGS. 8A and 8B are plan views of the semiconductor substrate 100 used to fabricate a semiconductor chip according to an exemplary embodiment of the present inventive concept. In particular, FIG. 8A is a plan view of a portion corresponding to the region Ib in FIG. 1A, and FIG. 8B is an enlarged view of region VIIIb illustrated in FIG. 8A.

Referring to FIGS. 8A and 8B together, the semiconductor substrate 100 may have the plurality of die regions 110 defined by the scribe lane 120 on the first side 102. The plurality of chip pads 112 may be arranged on the first side 102 of the semiconductor substrate 100 in each of the plurality of the die regions 110. The plurality of test pads 122 may be arranged on the first side 102 of the semiconductor substrate 100 in the scribe lane 120.

The passivation layer 140 and a cover protection layer 130b covering a portion of the passivation layer are disposed on the first side 102 of the semiconductor substrate 100. The cover protection layer 130b may cover a portion of the upper surface of the passivation layer 140.

The cover protection layer 130b may include a first cover protection layer 132 covering the die region 110 and a second cover protection layer 134b covering a portion of the scribe lane 120. The first cover protection layer 132 and the second cover protection layer 134b may be integrally formed.

The first cover protection layer 132 may include a portion of the cover protection layer 130b covering a portion of the scribe lane 120 adjacent to a die edge 110B. For example, the first cover protection layer 132 may include a cover central portion 132X covering the die region 110, and a cover peripheral portion 132Y having a constant first width W1 from the die edge 110B and surrounding the die region 110. The cover central portion 132X and the cover peripheral portion 132Y may be integrally formed.

The second cover protection layer 134b may include a crossing portion of a scribe lane 120 that is orthogonally extending. For example, a cover crossing portion 134Xb covering a portion between edges of four die regions 110 adjacent to each other, and a cover extending portion 134Yb which is a portion extending from the cover crossing portion 134Xb along the scribe lane 120. The cover crossing portion 134Xb and the cover extending portion 134Yb may be integrally formed.

The second cover protection layer 134b may have a split induction groove 134Gb disposed at an end of the portion extending along the scribe lane 120. The split induction groove 134Gb may extend towards the cover crossing portion 134Xb with a constant width. A width of an end of the cover extending portion 134Yb may be greater than a width of the split induction groove 134Gb in a same direction. Therefore, the end of the second cover protection layer 134b may be separated by the split induction groove 134Gb into 2 blunt portions having substantially identical widths and lengths of extension.

The end of the portion extending along the scribe lane 120 of the second cover protection layer 134b may be spaced apart from the plurality of test pads 122.

Figure 9:
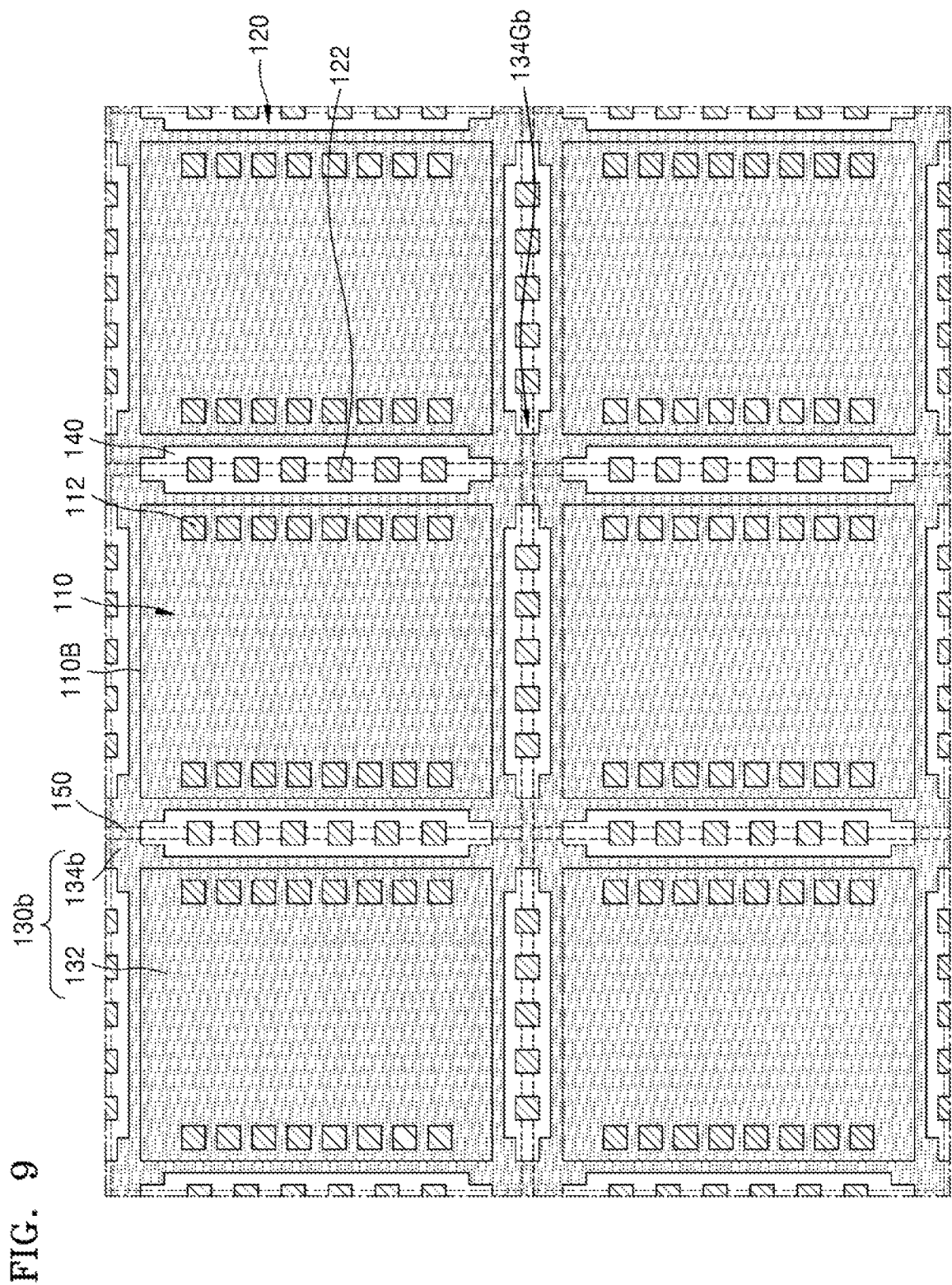
FIG. 9 is a plan view illustrating a method of fabricating a semiconductor chip from a semiconductor substrate according to an exemplary embodiment of the present inventive concept.

FIG. 9 is a plan view illustrating a method of fabricating a semiconductor chip from a semiconductor substrate, according to an exemplary embodiment of the present inventive concept.

Referring to FIG. 9, the modified layer 150 is formed in a same method as described in FIGS. 3A and 3B above.

A modified layer 150 may orthogonally extend to overlap the scribe lane 120. The modified layers 150 may be perpendicular to each other and extend under the second cover protection layer 134b and extend along a portion of the scribe lane 120 between the first cover protection layers 132 covering two die regions 110 which are adjacent to each other.

The modified layer 150 may be formed in the scribe lane 120 to overlap with the split induction groove 134Gb. The modified layer 150 may be formed to extend along a gap between two split induction grooves 134Gb facing each other in the scribe lane 120.

Figure 10:
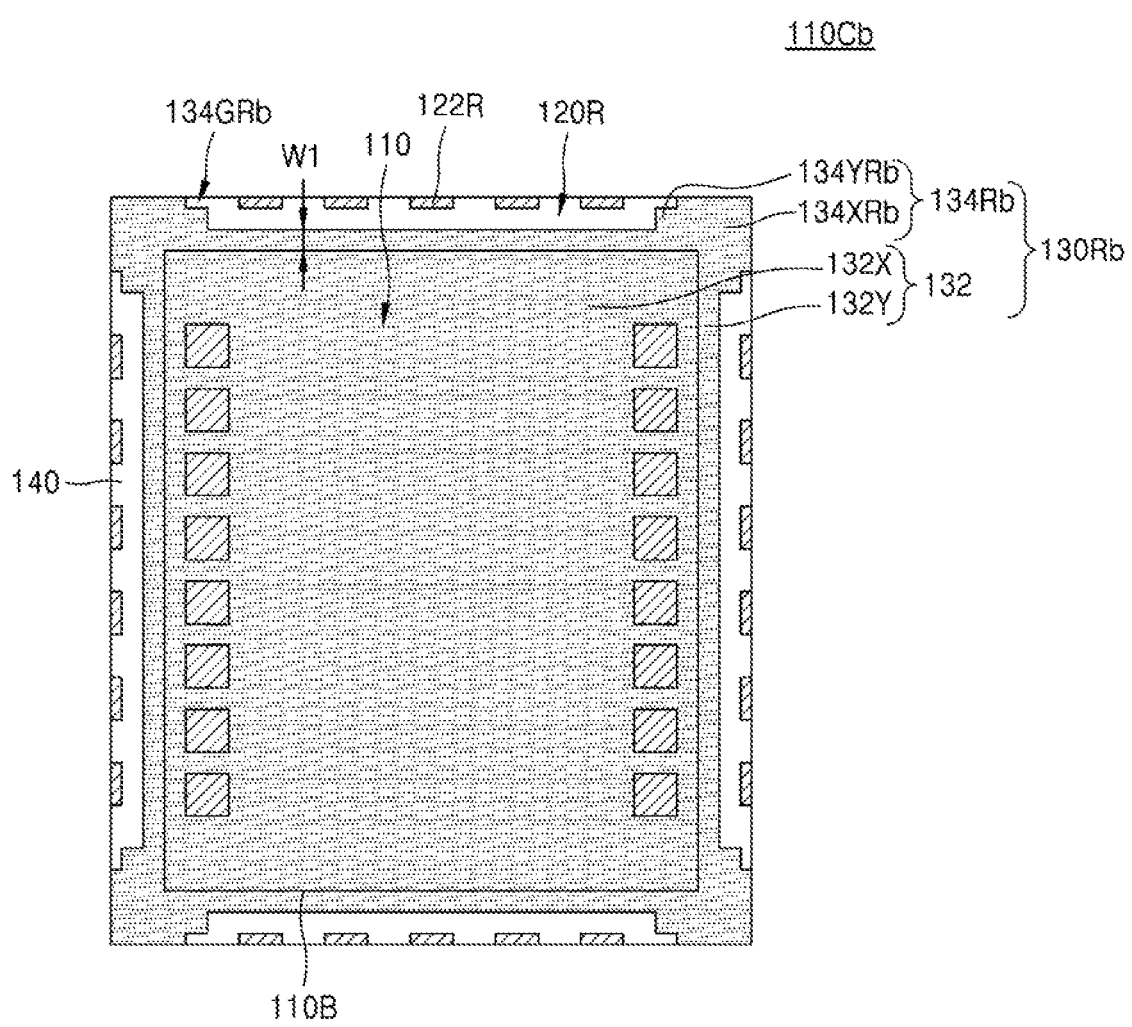
FIG. 10 is a plan view illustrating a semiconductor chip according to an exemplary embodiment of the present inventive concept.

FIG. 10 is a plan view of a semiconductor chip 110Cb according to an exemplary embodiment of the present inventive concept;

Referring to FIG. 10, the semiconductor chip 110Cb may include the die region 110 and the residual scribe lane 120R surrounding the periphery of the die region 110.

The semiconductor chip 110Cb may include the passivation layer 140 and a chip protection layer 130Rb covering a portion of the passivation layer 140.

The passivation layer 140 might not cover, but may instead expose the plurality of chip pads 112 and a plurality of residual test pads 122R.

The chip protection layer 130Rb may cover a portion of an upper surface of the passivation layer 140. The chip protection layer 130Rb may include the cover protection layer 132 covering the die region 110 and the buffering protection layer 134Rb covering a portion of the residual scribe lane 120R. The cover protection layer 132 and the buffering protection layer 134Rb may be integrally formed.

The cover protection layer 132 may further include a portion covering a portion of the residual scribe lane 120R adjacent to the die edge 110B. For example, the cover protection layer 132 may include the cover central portion 132X covering the die region 110, and the cover peripheral portion 132Y having a constant width from the die edge 110B and covering a portion of the plurality of residual scribe lanes 120R to surround the die region 110. The cover central portion 132X and the cover peripheral portion 132Y may be integrally formed.

The buffering protection layer 134Rb may include a corner protection layer 134XRb covering a portion of the residual scribe lane 120R at corners of the semiconductor chip 110Cb, and an extending protection layer 134YRb which is a portion extending from the corner protection layer 134XRb to the die edge 110B in the residual scribe lane 120R. The corner protection layer 134XRb and the extending protection layer 134YRb may be integrally formed.

The end of the extending protection layer 134YRb opposite to the corner protection layer 134XRb may have a separation groove 134GRb. A portion of the end of the extending protection layer 134YRb may be separated from the edge of the semiconductor chip 11 OCb by the separation groove 134GRb. The separation groove 134GRb may have a substantially constant width as it extends towards the corner protection layer 134XR. The residual scribe lane 120R extends in the direction of the die regions 110 of the semiconductor substrate 100 of the semiconductor chip 110Cb shown in FIGS. 1A through 1E. However, the separation groove 134GRb may have the substantially constant width in the direction extending towards the die regions 110 of the semiconductor substrate 100.

An end of the extending protection layer 134YRb may have a blunt shape. A portion of the extending protection layer 134YRb adjacent to the separation groove 134GRb may have the substantially constant width and extend towards the end of the extending protection layer 134YRb.

Figure 11:
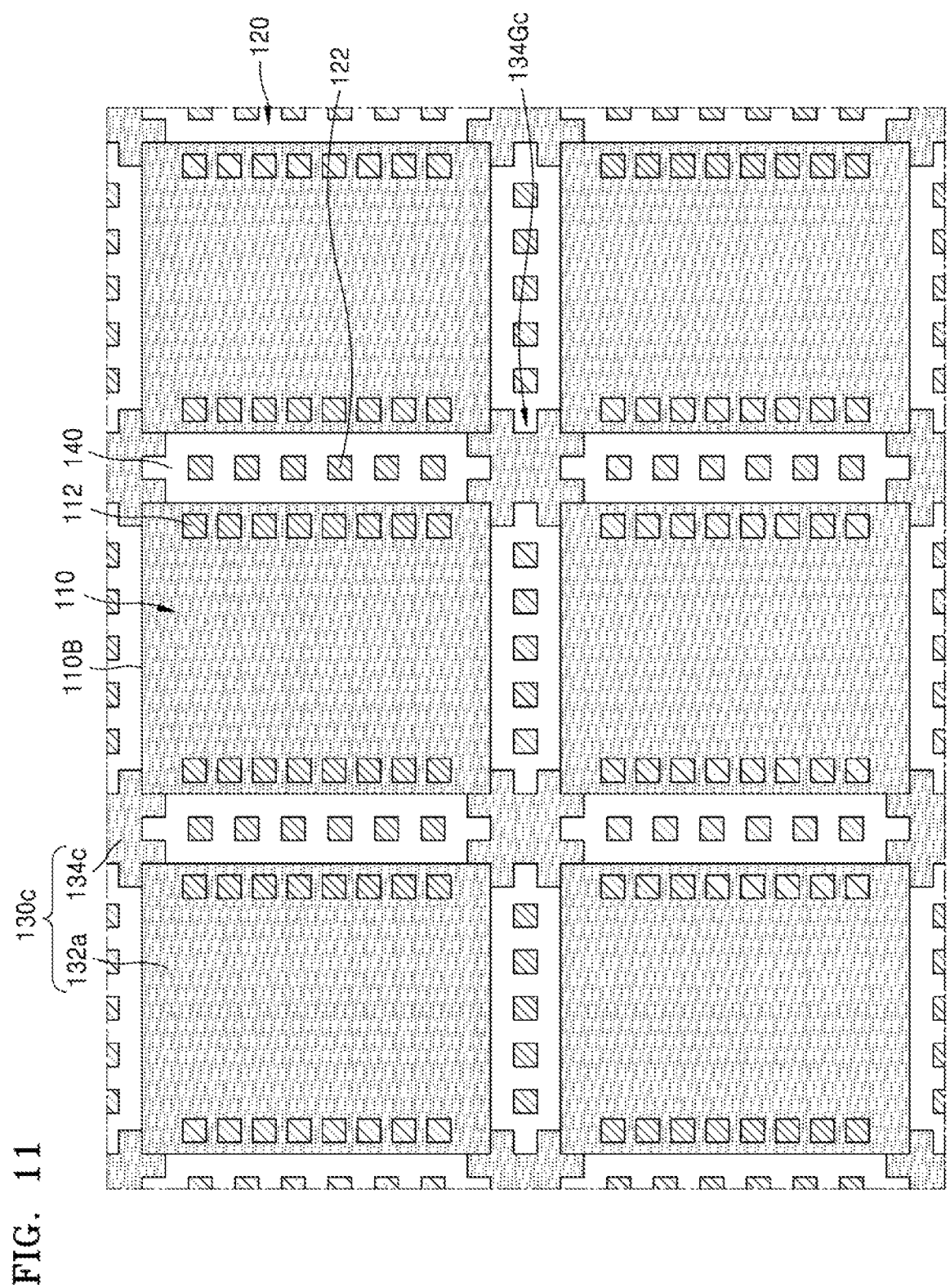
FIG. 11 is a plan view illustrating a semiconductor substrate used to fabricate a semiconductor chip according to an exemplary embodiment of the present inventive concept.

FIG. 11 is a plan view of the semiconductor substrate 100 used to fabricate a semiconductor chip according to an exemplary embodiment of the present inventive concept. In particular, FIG. 11 is a plan view of a portion corresponding to the region 1b illustrated in FIG. 1A.

Referring to FIG. 11, the semiconductor substrate 100 may have the plurality of die regions 110 defined by the scribe lane 120 on the first side 102 of the semiconductor substrate 100. The plurality of chip pads 112 may be arranged on the first side 102 of the semiconductor substrate 100 in each of the plurality of the die regions 110. The plurality of test pads 122 may be arranged on the first side 102 of the semiconductor substrate 100 in the scribe lane 120.

The passivation layer 140 and a cover protection layer 130c covering a portion of the passivation layer are disposed on the first side 102 of the semiconductor substrate 100. The cover protection layer 130c may cover a portion of the upper surface of the passivation layer 140.

The cover protection layer 130c may include a first cover protection layer 132a covering the die region 110 and a second cover protection layer 134c covering a portion of the scribe lane 120. The first cover protection layer 132a and the second cover protection layer 134c may be integrally formed.

The first cover protection layer 132a may be a portion covering an area of the die region 110 inside the die edge 110B. The first cover protection layer 132a might not cover the scribe lane 120.

The second cover protection layer 134c may include a crossing portion of the scribe lane 120 that is orthogonally extended. For example, the second cover protection layer 134c may include a portion disposed between edges of four die regions 110 adjacent to each other, and a portion extending along the scribe lane 120.

The second cover protection layer 134c may have a split induction groove 134Gc disposed at an end portion extending along the scribe lane 120. A width of the split induction groove 134Gc may have a substantially constant width and extend towards an interior of the second cover protection layer 134c. A width of an end portion extending along the scribe lane 120 of the second cover protection layer 134c may be greater than a width of the split induction groove 134Gc in a same direction. The end of the portion extending along the scribe lane 120 of the second cover protection layer 134c may be bifurcated by the split induction groove 134Gc disposed therebetween, and may include 2 blunt portions which have a substantially constant width and extend along the scribe lane 120.

The end portion extending along the scribe lane 120 of the second cover protection layer 134c may be spaced apart from the plurality of test pads 122.

Figure 12:
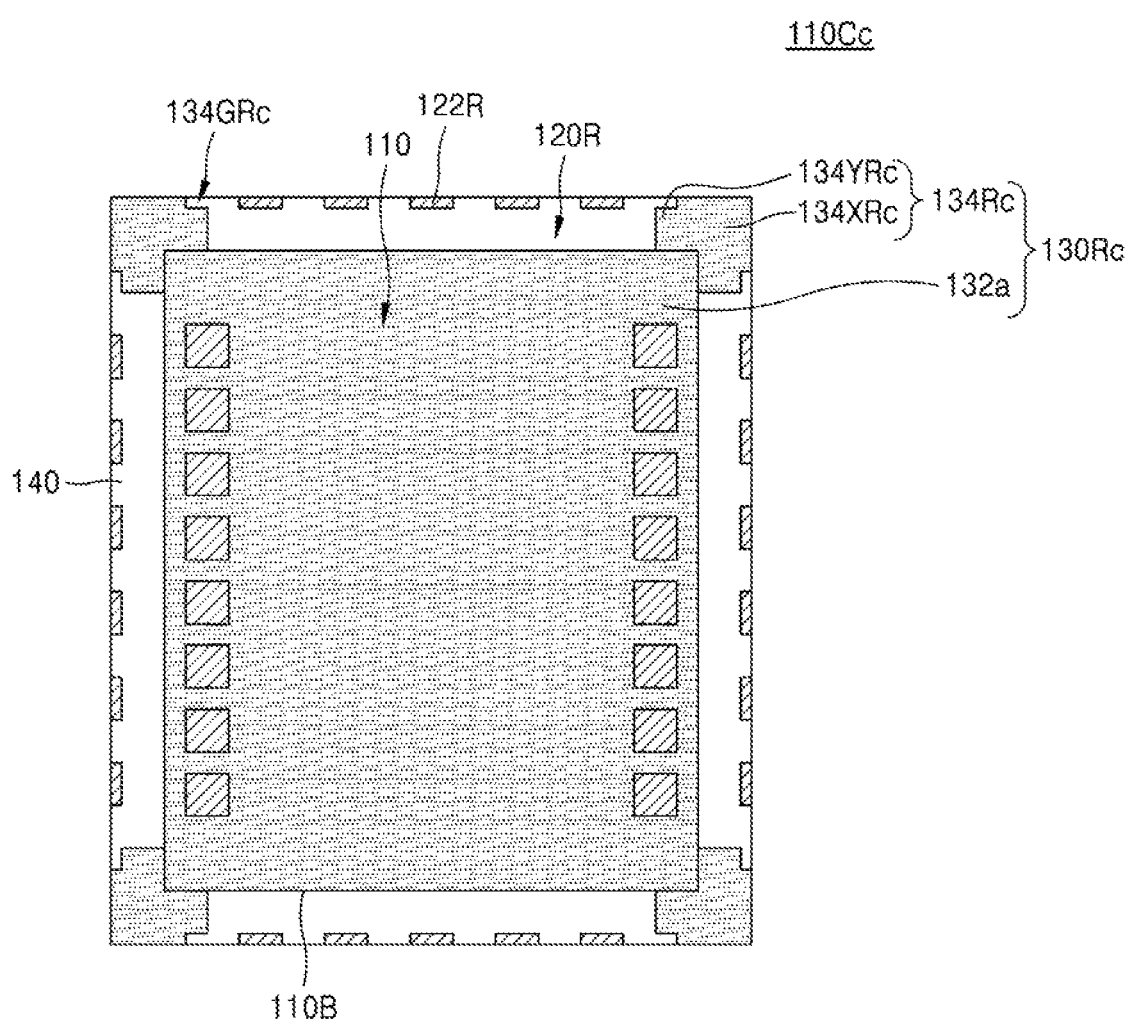
FIG. 12 is a plan view illustrating a semiconductor chip according to an exemplary embodiment of the present inventive concept.

FIG. 12 is a plan view of a semiconductor chip 110Cc according to an exemplary embodiment of the present inventive concept.

Referring to FIG. 12, the semiconductor chip 110Cc may include the die region 110 and the residual scribe lane 120R surrounding the periphery of the die region 110.

The semiconductor chip 110Cc may include the passivation layer 140 and a chip protection layer 130Rc covering a portion of the passivation layer 140.

The passivation layer 140 might not cover but may expose the plurality of chip pads 112 and a plurality of residual test pads 122R.

The chip protection layer 130Rc may cover a portion of an upper surface of the passivation layer 140. The chip protection layer 130Rc may include the cover protection layer 132a covering only the die region 110 inside the die edge 110B, and a buffering protection layer 134Rc covering a portion of the plurality of residual scribe lanes 120R. The cover protection layer 132a and the buffering protection layer 134Rc may be integrally formed.

The buffering protection layer 134Rc may include the corner protection layer 134XRc covering a portion of the plurality of residual scribe lanes 120R disposed on corners of the semiconductor chip 110Cc, and an extending protection layer 134YRc which is a portion in contact with the cover protection layer 132a and extends along a portion of the die edge 110B in the residual scribe lane 120R. The corner protection layer 134XRc and the extending protection layer 134YRc may be integrally formed.

An end of the extending protection layer 134YRc opposite to the corner protection layer 134XRc may be apart from the residual test pad 122R. The end of the extending protection layer 134YRc opposite to the corner protection layer 134XRc may have a separation groove 134GRc. The separation groove 134GRc may have a substantially constant width extending towards the corner protection layer 134XRc. A portion of the end of the extending protection layer 134YRc may be separated from the edge of the semiconductor chip 110Cc by the separation groove 134GRc. An end of the extending protection layer 134YRc may have a blunt shape. A portion of the extending protection layer 134YRc adjacent to the separation groove 134GRc may have the substantially constant width and extend towards the end of the extending protection layer 134YRc.

Figure 13A:
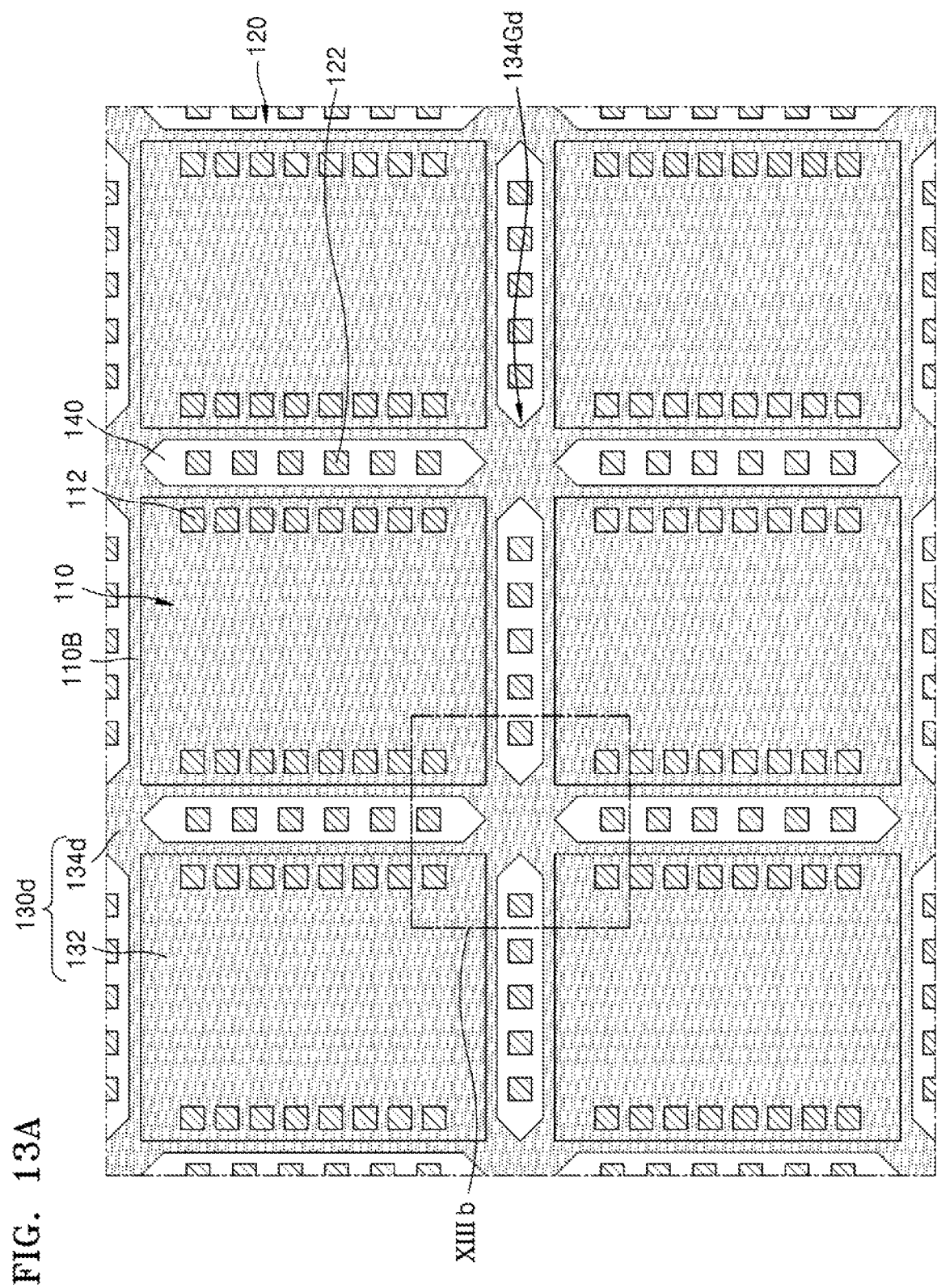
FIG. 13A and is a plan view illustrating a semiconductor substrate used to fabricate a semiconductor chip according to an exemplary embodiment of the present inventive concept.
Figure 13B:
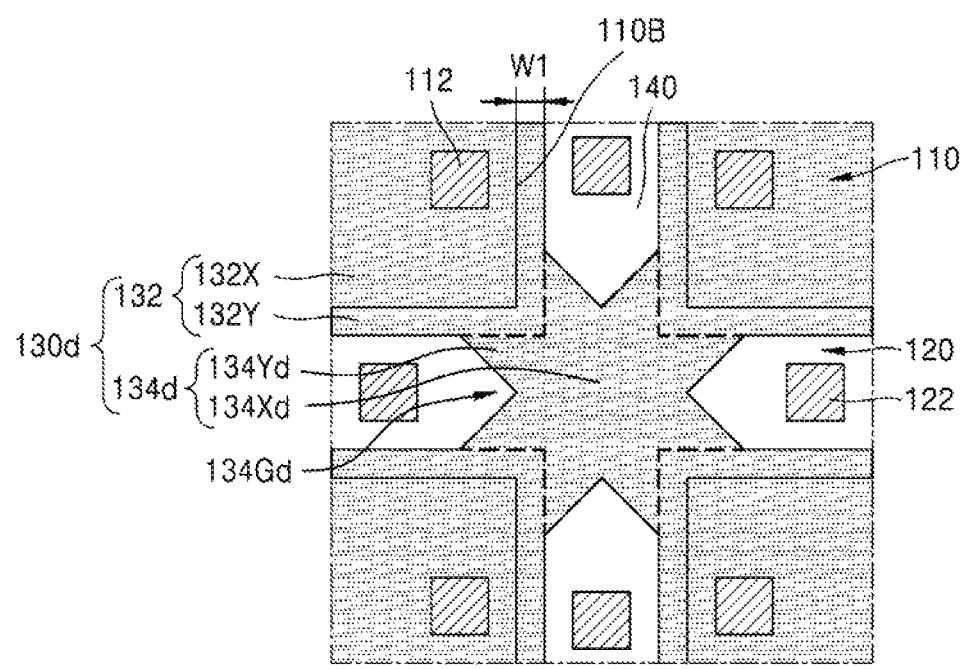
FIG. 13B is an enlarged plan view illustrating of area XIIIb of FIG. 13A.

FIGS. 13A and 13B are plan views of a semiconductor substrate 100 used to fabricate a semiconductor chip according to an exemplary embodiment of the present inventive concept. In particular, FIG. 13A is a plan view of a portion corresponding to the region 1b in FIG. 1A, and FIG. 13B is an enlarged view of region XIIb in FIG. 13A.

Referring to FIGS. 13A and 13B together, the semiconductor substrate 100 may have the plurality of die regions 110 defined by the scribe lane 120 on the first side 102. The plurality of chip pads 112 may be arranged on the first side 102 of the semiconductor substrate 100 in each of the plurality of the die regions 110. The plurality of test pads 122 may be arranged on the first side 102 of the semiconductor substrate 100 in the scribe lane 120.

The passivation layer 140 and a cover protection layer 130d covering a portion of the passivation layer are disposed on the first side 102 of the semiconductor substrate 100. The cover protection layer 130d may cover a portion of the upper surface of the passivation layer 140.

The cover protection layer 130 may include a first cover protection layer 132 covering the die region 110 and a second cover protection layer 134d covering a portion of the scribe lane 120. The first cover protection layer 132 and the second cover protection layer 134d may be integrally formed.

The first cover protection layer 132 may include a portion of the cover protection layer 130 covering a portion of the scribe lane 120 adjacent to a die edge 110B. For example, the first cover protection layer 132 may include a cover central portion 132X covering the die region 110, and a cover peripheral portion 132Y surrounding the die region 110 and having a constant first width W1 from the die edge 110B. The cover central portion 132X and the cover peripheral portion 132Y may be integrally formed.

The second cover protection layer 134d may include a crossing portion of a scribe lane 120 that is orthogonally extended. For example, the second cover protection layer 134d may include a cover crossing portion 134Xd covering a portion disposed between edges of four die regions 110 adjacent to each other, and a cover extending portion 134Yd which is a portion extending from the cover crossing portion 134Xd along the scribe lane 120. The cover crossing portion 134Xd and the cover extending portion 134Yd may be integrally formed.

The second cover protection layer 134d may have a split induction groove 134Gd disposed at an end portion extending along the scribe lane 120. The split induction groove 134Gd may extend towards the cover crossing portion 134Xd and have a width that gradually decreases in the direction of extension. A width of an end of the cover extending portion 134Yd may be the same as a maximum width of the split induction groove 134Gd in the same direction. Therefore, the end of the second cover protection layer 134d may be bifurcated by the split induction groove 134Gd disposed therebetween, and may include 2 sharp portions that extend along the scribe lane 120 and narrow in width in the direction of extension.

The end portion of the second cover protection layer 134d extending along the scribe lane 120 of the second cover protection layer 134d may be spaced apart from the plurality of test pads 122.

Figure 14:
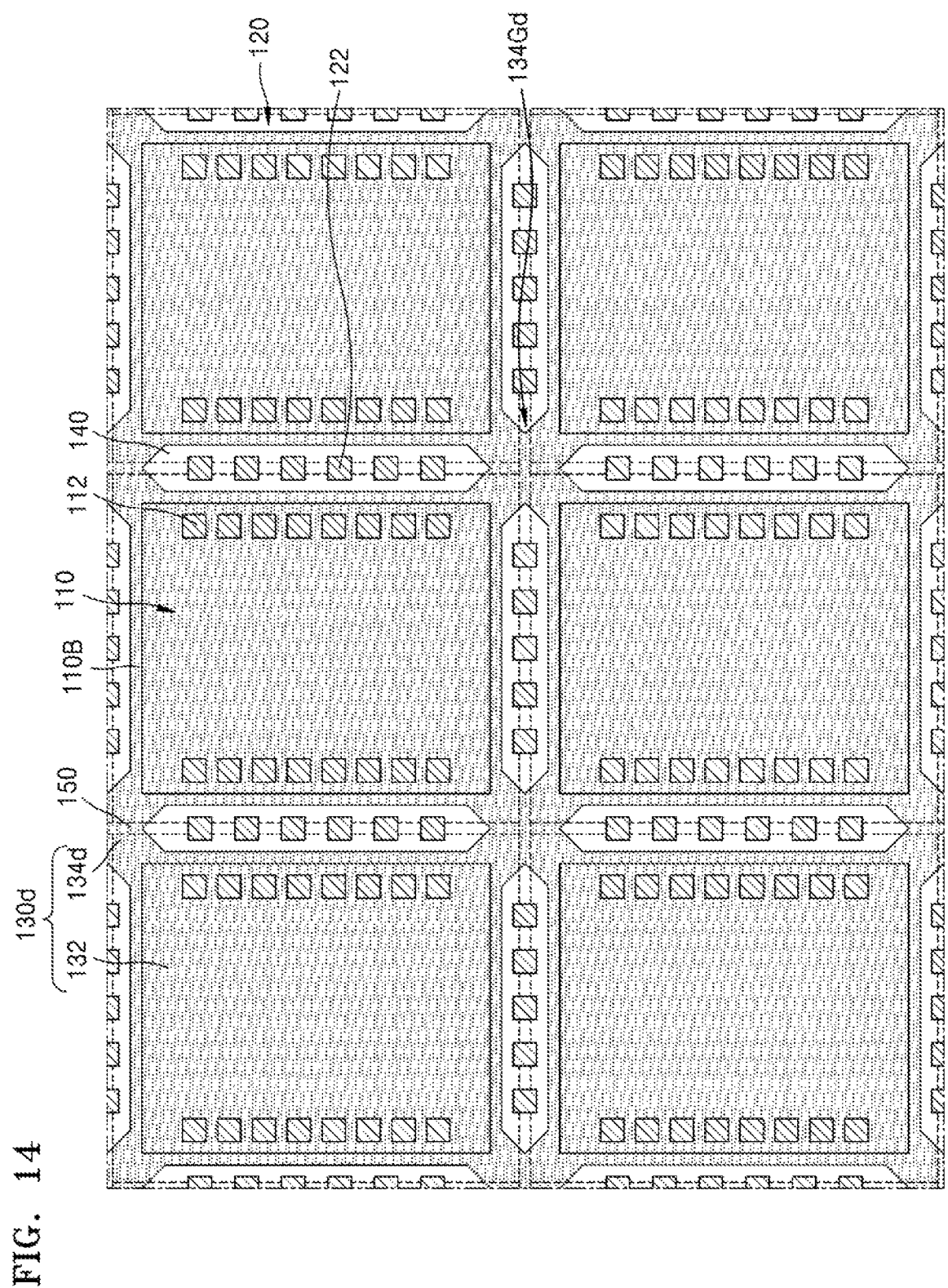
FIG. 14 is a plan view illustrating a method of fabricating a semiconductor chip according to an exemplary embodiment of the inventive concept.

FIG. 14 is a plan view illustrating a method of fabricating a semiconductor chip, according to an exemplary embodiment of the present inventive concept.

Referring to FIG. 14, the modified layer 150 is formed in a same method as described above in FIGS. 3A and 3B.

A modified layer 150 may orthogonally extend in the scribe lane 120. The modified layers 150 may be perpendicular to each other under the second cover protection layer 134d and extend along a portion of the scribe lane 120 between the first cover protection layer 132 covering two die regions 110 which are adjacent to each other.

The modified layer 150 may be formed in the scribe lane 120 to overlap with the split induction groove 134Gd. The modified layer 150 may be formed to extend along a gap between two split induction grooves 134Gd facing each other in the scribe lane 120.

Figure 15:
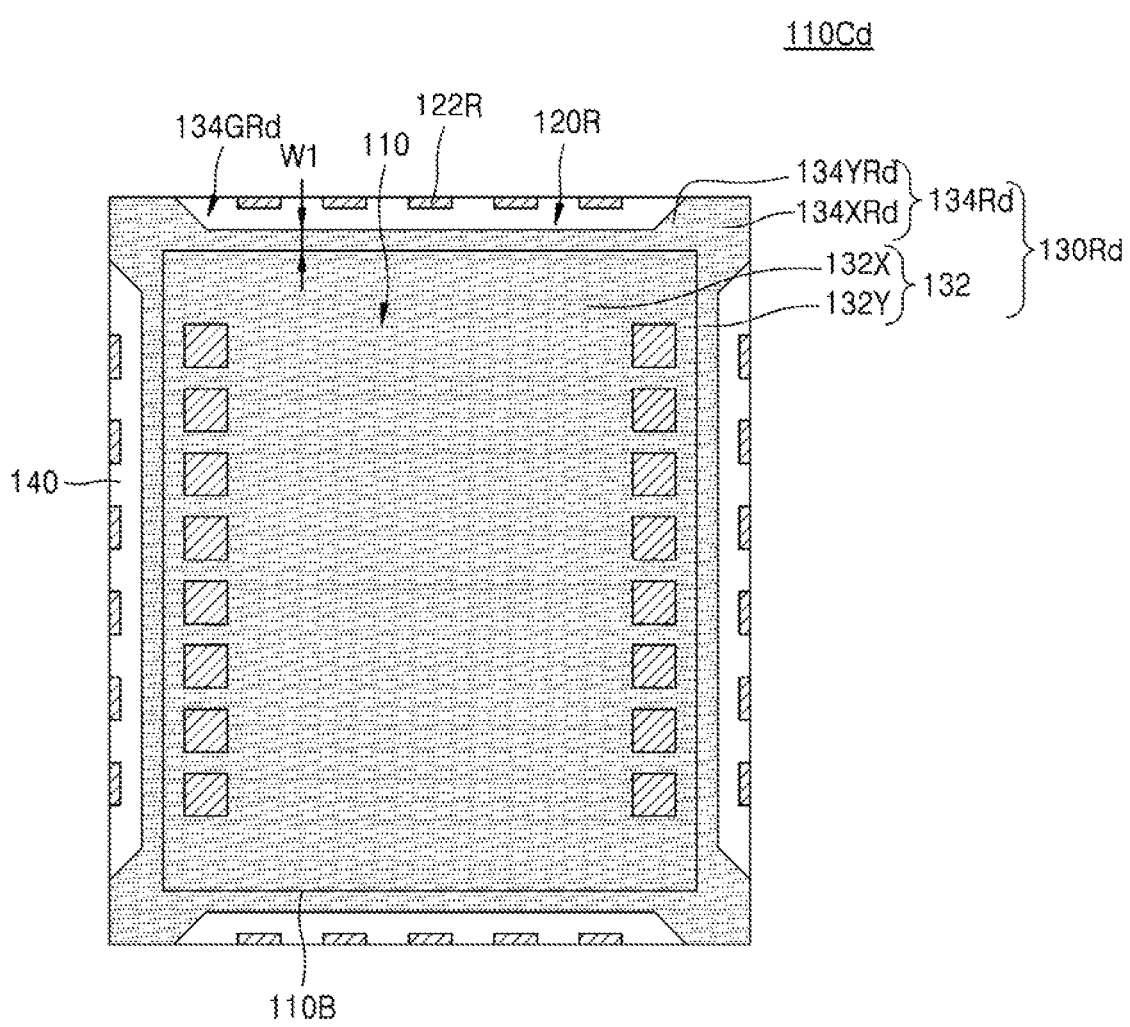
FIG. 15 is a plan view illustrating a semiconductor chip according to an exemplary embodiment of the present inventive concept.

FIG. 15 is a plan view of a semiconductor chip 110Cd according to an embodiment of the inventive concept.

Referring to FIG. 15, the semiconductor chip 110Cd may include the die region 110 and the residual scribe lane 120R surrounding the periphery of the die region 110.

The semiconductor chip 110Cd may include the passivation layer 140 and a chip protection layer 130Rd covering a portion of the passivation layer 140.

The passivation layer 140 might not cover, but instead may expose the plurality of chip pads 112 and a plurality of residual test pads 122R.

The chip protection layer 130Rd may cover a portion of an upper surface of the passivation layer 140. The chip protection layer 130Rd may include the cover protection layer 132 covering the die region 110 and the buffering protection layer 134Rd covering a portion of the residual scribe lane 120R. The cover protection layer 132 and the buffering protection layer 134Rd may be integrally formed.

The cover protection layer 132 may further include a portion covering a portion of the residual scribe lane 120R adjacent to the die edge 110B. For example, the cover protection layer 132 may include the cover central portion 132X covering the die region 110, and the cover peripheral portion 132Y having a constant width extending from the die edge 110B towards the scribe lane 120R and covering a portion of the plurality of residual scribe lanes 120R to surround the die region 110. The cover central portion 132X and the cover peripheral portion 132Y may be integrally formed.

The buffering protection layer 134Rd may include a corner protection layer 134XRd covering a portion of the residual scribe lane 120R of corners of the semiconductor chip 110Cd, and an extending protection layer 134YRd which is a portion extending from the corner protection layer 134XRd to the die edge 110B in the residual scribe lane 120R. The corner protection layer 134XRd and the extending protection layer 134YRd may be integrally formed.

The end of the extending protection layer 134YRd opposite to the corner protection layer 134XRd may have a separation groove 134GRd. A portion of the extending protection layer 134YRd may be separated from the edge of the semiconductor chip 110Cd by the separation groove 134GRd. The separation groove 134GRd may extend towards the corner protection layer 134XRd and narrow in width in the direction of extension. An end of the extending protection layer 134YRd may have a sharp shape. A portion of the extending protection layer 134YRd adjacent to the separation groove 134GRd may extend towards the die region 110 and may narrow in width.

Figure 16:
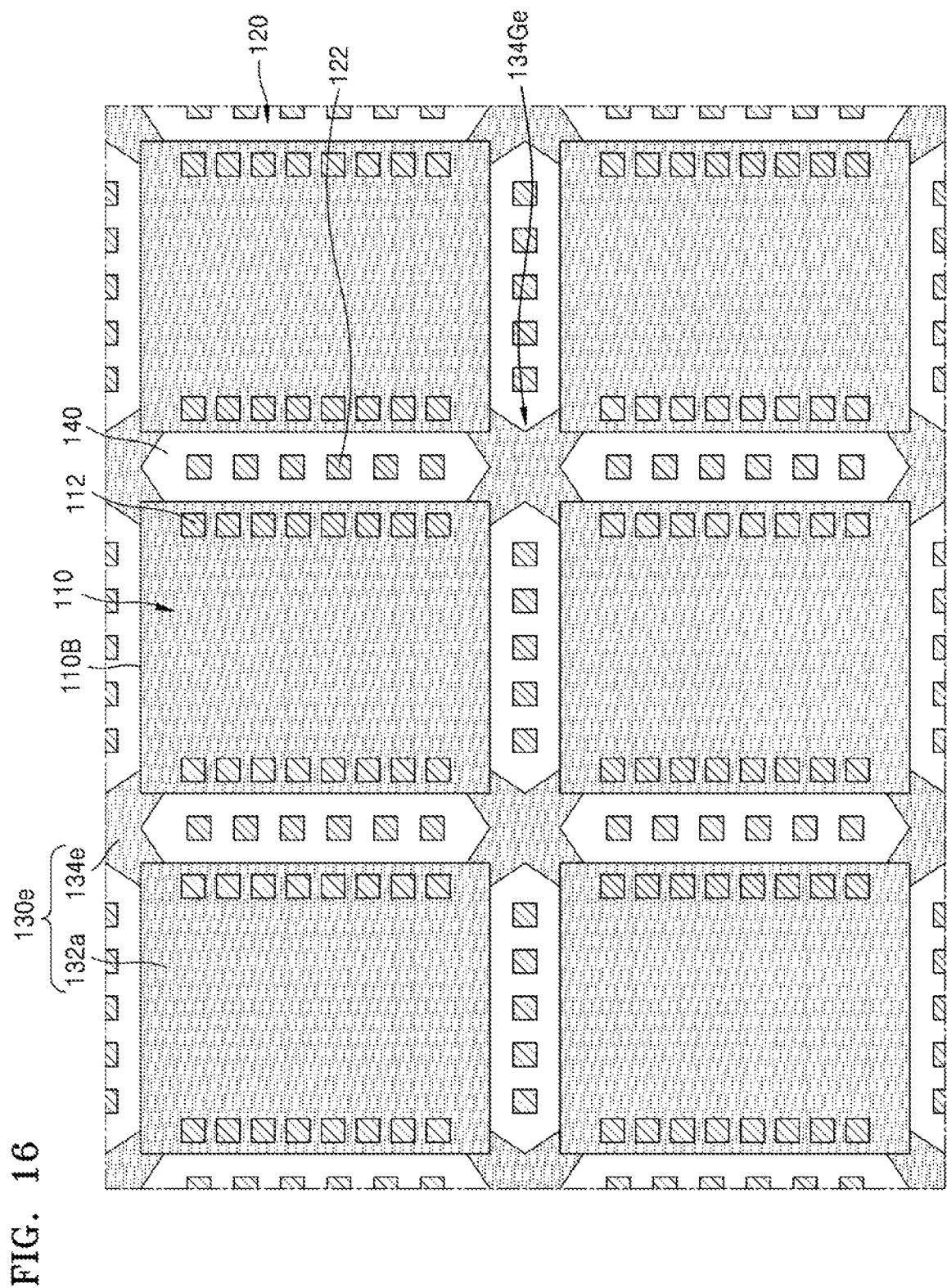
FIG. 16 is a plan view illustrating a semiconductor substrate used to fabricate a semiconductor chip according to an exemplary embodiment of the present inventive concept.

FIG. 16 is a plan view of the semiconductor substrate 100 used to fabricate a semiconductor chip according to an exemplary embodiment of the present inventive concept. In particular, FIG. 16 is a plan view of a portion corresponding to the region Ib in FIG. 1A.

Referring to FIG. 16, the semiconductor substrate 100 may have the plurality of die regions 110 defined by the scribe lane 120 on the first side 102 of the semiconductor substrate 100. The plurality of chip pads 112 may be arranged on the first side 102 of the semiconductor substrate 100 in each of the plurality of the die regions 110. The plurality of test pads 122 may be arranged on the first side 102 of the semiconductor substrate 100 in the scribe lane 120.

The passivation layer 140 and a cover protection layer 130e covering a portion of the passivation layer are disposed on the first side 102 of the semiconductor substrate 100. The cover protection layer 130e may cover a portion of the upper surface of the passivation layer 140.

The cover protection layer 130e may include a first cover protection layer 132a covering the die region 110 and a second cover protection layer 134e covering a portion of the scribe lane 120. The first cover protection layer 132a and the second cover protection layer 134e may be integrally formed.

The first cover protection layer 132a may be a portion covering the die region 110 inside the die edge 110B. The first cover protection layer 132a might not cover the scribe lane 120.

The second cover protection layer 134e may include a crossing portion of the scribe lane 120 that is orthogonally extending. For example, the second cover protection layer 134e includes a portion disposed between edges of four die regions 110 adjacent to each other, and a portion extending along the scribe lane 120.

The second cover protection layer 134e may have a split induction groove 134Ge at an end of the portion extending along the scribe lane 120. A width of the split induction groove 134Ge may extend towards an interior of the second cover protection layer 134e and may gradually narrow. A width of an end of the portion extending along the scribe lane 120 of the second cover protection layer 134e may be same as a maximum width of the split induction groove 134Ge in the same direction. The end portion of the second cover protection layer 134e extending along the scribe lane 120 may be bifurcated by the split induction groove 134Ge disposed therebetween, and may include 2 sharp portions which extend along the scribe lane 120 and narrow in width.

The end of the portion extending along the scribe lane 120 of the second cover protection layer 134e may be spaced apart from the plurality of test pads 122.

Figure 17:
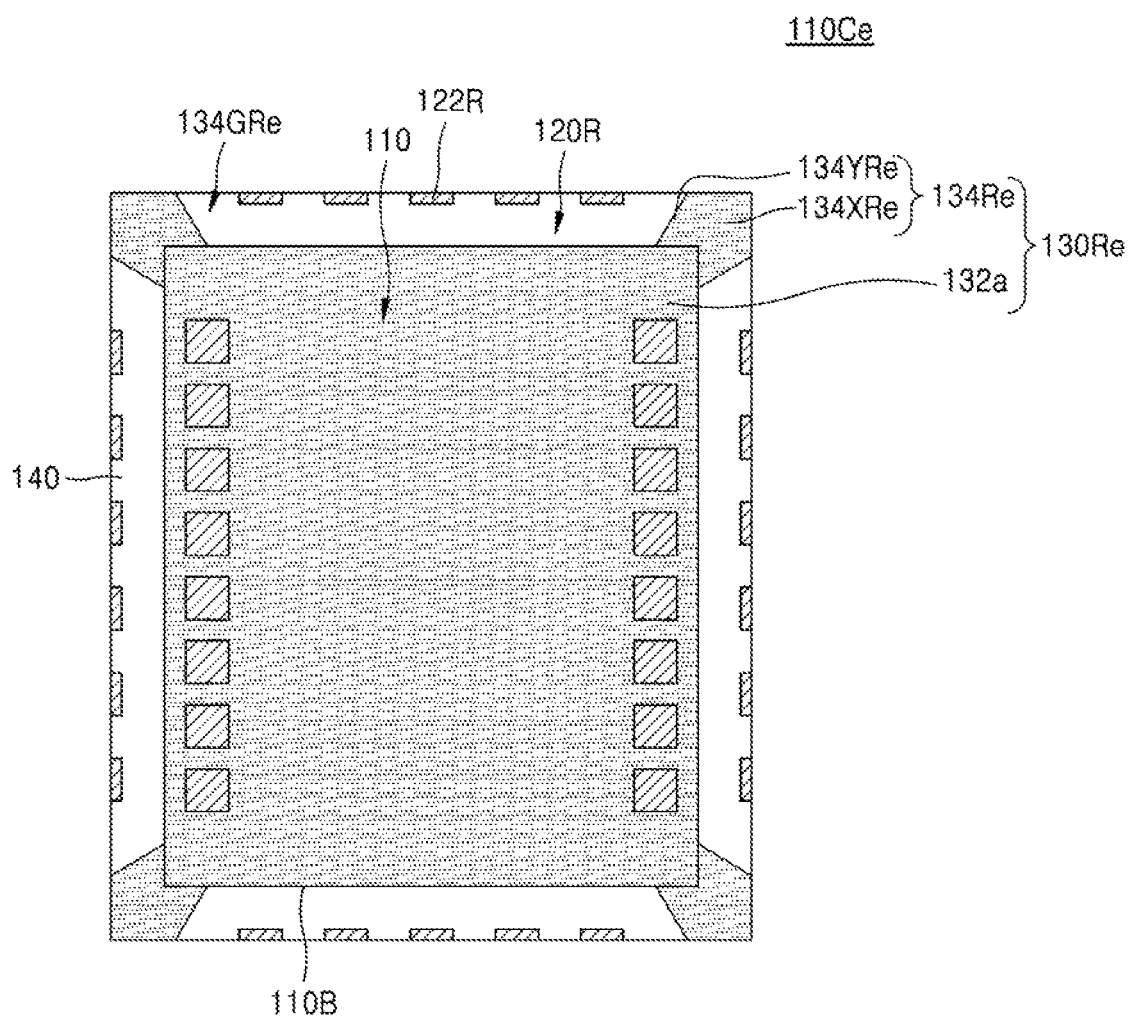
FIG. 17 is a plan view illustrating a semiconductor chip according to an exemplary embodiment of the present inventive concept.

FIG. 17 is a plan view of a semiconductor chip 110Ce according to an exemplary embodiment of the present inventive concept;

Referring to FIG. 17, the semiconductor chip 110Ce may include the die region 110 and the residual scribe lane 120R surrounding the periphery of the die region 110.

The semiconductor chip 110Ce may include the passivation layer 140 and a chip protection layer 130Re covering a portion of the passivation layer 140.

The passivation layer 140 might not cover, but may instead expose the plurality of chip pads 112 and a plurality of residual test pads 122R.

The chip protection layer 130Re may cover a portion of an upper surface of the passivation layer 140. The chip protection layer 130Re may include the cover protection layer 132a covering only the die region 110 inside the die edge 110B, and a buffering protection layer 134Re covering a portion of the plurality of residual scribe lanes 120R. The cover protection layer 132a and the buffering protection layer 134Re may be integrally formed.

The buffering protection layer 134Re may include the corner protection layer 134XRe covering a portion of the plurality of residual scribe lanes 120R of corners of the semiconductor chip 110Ce, and an extending protection layer 134YRe which is a portion in contact with the cover protection layer 132a and extends along a portion of the die edge 110B in the residual scribe lane 120R. The corner protection layer 134XRe and the extending protection layer 134YRe may be integrally formed.

An end of the extending protection layer 134YRe opposite to the corner protection layer 134XRe may be spaced apart from the residual test pad 122R. The end of the extending protection layer 134YRe opposite to the corner protection layer 134XRe may have a separation groove 134GRe. The separation groove 134GRe may extend towards the corner protection layer 134XRe and narrow in width in the direction of extension. A portion of an end of the extending protection layer 134YRe may be separated from the edge of the semiconductor chip 110Ce by the separation groove 134GRe. The end of the extending protection layer 134YRe may have a sharply pointed shape. A portion of the extending protection layer 134YRe adjacent to the separation groove 134GRe may extend towards the end of the extending protection layer 134YRe and may narrow in width in the direction of extension.

While the inventive concept has been particularly shown and described with reference to embodiments thereof, it will be understood that various changes in form and details may be made therein without departing from the spirit and scope of the present disclosure.

What is claimed is:

1. A semiconductor chip comprising:
a semiconductor substrate comprising a residual scribe lane at least partially surrounding a die region having a die edge;
a passivation layer at least partially covering the semiconductor substrate; and
a cover protection layer disposed on a portion of the passivation layer and the die region, wherein the cover protection layer is formed integrally with a buffering protection layer covering a portion of the residual scribe lane,
wherein the buffering protection layer comprises a corner protection layer that is in contact with a portion of an edge adjacent to a corner of the semiconductor substrate, and an extending protection layer extending along the residual scribe lane extending from a surface of the corner protection layer and contacting the cover protection layer.

2. The semiconductor chip of claim 1, wherein a portion of an end of the extending protection layer opposite to the corner protection layer is spaced apart from a corner of the semiconductor substrate by a separation groove.

3. The semiconductor chip of claim 2, wherein a width of the separation groove decreases in a direction towards the corner protection layer.

4. The semiconductor chip of claim 2, wherein the separation groove has a constant width in a direction extending towards the corner protection layer.

5. The semiconductor chip of claim 2, wherein a portion of the extending protection layer in contact with the separation groove decreases in width in a direction away from the corner protection layer.

6. The semiconductor chip of claim 2, wherein a portion of the extending protection layer in contact with the separation groove has a constant width extending away from the corner protection layer.

7. The semiconductor chip of claim 1, wherein an end of the extending protection layer opposite to the corner protection layer has a pointed shape.

8. The semiconductor chip of claim 1, wherein an end of the extending protection layer opposite to the corner protection layer has a blunt shape.

9. The semiconductor chip of claim 1, further comprising:
a residual test pad in the residual scribe lane that is not covered by the passivation layer or the buffering protection layer,
wherein an end of the extending protection layer opposite to the corner protection layer is spaced apart from the residual test pad.

10. The semiconductor chip of claim 9, wherein a distance between the end of the extending protection layer and the residual test pad is less than an extending length from the die edge to the end of the extending protection layer.

11. The semiconductor chip of claim 1, wherein a lower surface of the buffering protection layer is in contact with upper surfaces of all of a plurality of passivation layers.

12. The semiconductor chip of claim 1, wherein the cover protection layer comprises a cover central portion covering the inside of the die edge and a cover peripheral portion having a constant width from the die edge to surround the cover central portion and covering a portion of the residual scribe lane, wherein the extending protection layer is in contact with the cover peripheral portion.

13. The semiconductor chip of claim 12, wherein a width of the residual scribe lane is greater than a width of the cover peripheral portion.

14. A semiconductor chip comprising:
a semiconductor substrate comprising a die region in which a plurality of chip pads are arranged and a residual scribe lane surrounding a periphery of an edge of the die region in which a plurality of residual test pads are arranged;
a passivation layer at least partially covering the semiconductor substrate and exposing the plurality of chip pads and the plurality of residual test pads; and
a cover protection layer at least partially covering and integrating with a portion of the passivation layer,
wherein the cover protection layer comprises a first portion at least partially covering an interior area of the die edge, a second portion in contact with a portion of an edge adjacent to a corner of the semiconductor substrate in the residual scribe lane, and a third portion extending from the second portion along the residual scribe lane and spaced apart from the plurality of residual test pads, wherein a portion of an end of the third portion opposite to the second portion is spaced apart from an edge of the semiconductor substrate.

15. The semiconductor chip of claim 14, wherein the residual scribe lane extends in a direction of the die regions of the semiconductor substrate and extends along the die edge.

16. The semiconductor chip of claim 15, wherein a separation groove between the edge of the semiconductor substrate and the third portion extends in the direction of the die regions of the semiconductor substrate.

17. The semiconductor chip of claim 14, wherein the cover protection layer further comprises a fourth portion having a constant width from the die edge to surround the first portion and covering a portion of the residual scribe lane, and the third portion is in contact with the fourth portion and extends along the residual scribe lane.

18. A semiconductor chip comprising:
 a semiconductor substrate comprising a die region in which a plurality of chip pads are arranged and a residual scribe lane at least partially surrounding a periphery of a die edge of the die region,
 a passivation layer at least partially covering a portion above the semiconductor substrate; and
 a cover protection layer at least partially covering a portion of the passivation layer, wherein the residual scribe lane comprises a plurality of crossing regions, which are a portion adjacent to each corner of the semiconductor substrate, and a test region, which is a portion wherein a plurality of residual test pads are disposed between the plurality of crossing regions, and wherein the cover protection layer comprises:
 a cover central portion at least partially covering the area inside of the die edge,
 a cover peripheral portion having a constant width from the die edge and surrounding the cover central portion and covering a portion of the residual scribe lane,
 a corner protection layer in contact with a portion of an edge of the semiconductor substrate in the crossing region, and
 an extending protection layer extending from the corner protection layer along the residual scribe lane and in contact with the cover peripheral portion in the crossing region.

19. The semiconductor chip of claim 18, wherein the extending protection layer is spaced apart from the plurality of residual test pads, and a portion of an end of the extending protection layer opposite to the corner protection layer is spaced apart from the edge of the semiconductor substrate.

20. The semiconductor chip of claim 18, wherein the passivation layer covers substantially all of the semiconductor substrate in the crossing region.

* * * * *